US011361942B2

(12) United States Patent
Valcore, Jr. et al.

(10) Patent No.: US 11,361,942 B2
(45) Date of Patent: Jun. 14, 2022

(54) ADJUSTMENT OF POWER AND FREQUENCY BASED ON THREE OR MORE STATES

(71) Applicant: Lam Research Corporation, Fremont, CA (US)

(72) Inventors: John C. Valcore, Jr., Fremont, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/847,492

(22) Filed: Apr. 13, 2020

(65) Prior Publication Data

US 2020/0243304 A1 Jul. 30, 2020

Related U.S. Application Data

(60) Continuation of application No. 15/219,918, filed on Jul. 26, 2016, now Pat. No. 10,629,413, which is a division of application No. 14/016,841, filed on Sep. 3, 2013, now Pat. No. 9,462,672, and a continuation-in-part of application No. 13/620,386, filed on Sep. 14, 2012, now Pat. No. 9,197,196, and a continuation-in-part of application No. 13/531,491, filed on Jun. 22, 2012, now Pat. No. 9,114,666, said
(Continued)

(51) Int. Cl.
*H01J 37/32* (2006.01)
*H05H 1/46* (2006.01)
*H03J 7/00* (2006.01)
*H01J 37/244* (2006.01)

(52) U.S. Cl.
CPC ...... *H01J 37/32183* (2013.01); *H01J 37/244* (2013.01); *H01J 37/32082* (2013.01); *H01J 37/32137* (2013.01); *H01J 37/32174* (2013.01); *H03J 7/00* (2013.01); *H05H 1/46* (2013.01); *H01J 37/32146* (2013.01); *H01J 37/32155* (2013.01); *H05H 2242/20* (2021.05)

(58) Field of Classification Search
CPC ............ H01J 37/32183; H01J 37/244; H01J 37/32082; H01J 37/32174; H01J 37/32137; H01J 37/32155; H01J 37/32146; H03J 7/00; H05H 1/46; H05H 2242/20
See application file for complete search history.

(56) References Cited

U.S. PATENT DOCUMENTS

| | | | | |
|---|---|---|---|---|
| 8,110,991 B2 * | 2/2012 | Coumou | ................ | H05H 1/46 315/111.21 |
| 2011/0309049 A1 * | 12/2011 | Papasouliotis | .... | H01J 37/32412 216/37 |

* cited by examiner

*Primary Examiner* — Duy Vu N Deo
(74) *Attorney, Agent, or Firm* — Penilla IP, APC

(57) ABSTRACT

Systems and methods for adjusting power and frequency based on three or more states are described. One of the methods includes receiving a pulsed signal having multiple states. The pulsed signal is received by multiple radio frequency (RF) generators. When the pulsed signal having a first state is received, an RF signal having a pre-set power level is generated by a first RF generator and an RF signal having a pre-set power level is generated by a second RF generator. Moreover, when the pulsed signal having a second state is received, RF signals having pre-set power levels are generated by the first and second RF generators. Furthermore, when the pulsed signal having a third state is received, RF signals having pre-set power levels are generated by the first and second RF generators.

13 Claims, 23 Drawing Sheets

Related U.S. Application Data application No. 14/016,841 is a continuation-in-part of application No. 13/666,912, filed on Nov. 1, 2012, now Pat. No. 9,171,699, and a continuation-in-part of application No. 13/531,491, filed on Jun. 22, 2012, now Pat. No. 9,114,666, said application No. 13/666,912 is a continuation-in-part of application No. 13/550,719, filed on Jul. 17, 2012, now Pat. No. 9,368,329.

(60) Provisional application No. 61/701,574, filed on Sep. 14, 2012, provisional application No. 61/602,040, filed on Feb. 22, 2012, provisional application No. 61/701,560, filed on Sep. 14, 2012, provisional application No. 61/602,041, filed on Feb. 22, 2012.

ADJUSTMENT OF POWER AND FREQUENCY BASED ON THREE OR MORE STATES

CLAIM OF PRIORITY

This application is a continuation of and claims the benefit of and priority, under 35 U.S.C. § 120, to U.S. patent application Ser. No. 15/219,918, filed on Jul. 26, 2016, and titled "Adjustment of Power and Frequency Based on Three or More States", which is a divisional of and claims the benefit of and priority, under 35 U.S.C. § 120, to U.S. patent application Ser. No. 14/016,841, filed on Sep. 3, 2013, titled "Adjustment of Power and Frequency Based on Three or More States", and issued as U.S. Pat. No. 9,462,672, which claims the benefit of and priority to, under 35 U.S.C. § 119(e), to U.S. Provisional Patent Application No. 61/701,574, filed on Sep. 14, 2012, and titled "Sub-state Based Adjustment of Power and Frequency", all of which are hereby incorporated by reference in their entirety for all purposes.

The U.S. patent application Ser. No. 14/016,841 is a continuation-in-part of and claims the benefit of and priority, under 35 U.S.C. § 120, to U.S. patent application Ser. No. 13/620,386, filed on Sep. 14, 2012, titled "State-based Adjustment of Power and Frequency", and issued as U.S. Pat. No. 9,197,196, which claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", all of which are incorporated by reference herein in their entirety for all purposes.

The U.S. patent application Ser. No. 13/620,386 is a continuation-in-part of and claims the benefit of and priority, under 35 U.S.C. § 120, to U.S. patent application Ser. No. 13/531,491, filed on Jun. 22, 2012, issued as U.S. Pat. No. 9,114,666, and titled "Methods and Apparatus For Controlling Plasma In A Plasma Processing System", which is incorporated by reference herein in its entirety.

The U.S. patent application Ser. No. 14/016,841 is a continuation-in-part of and claims the benefit of and priority, under 35 U.S.C. § 120, to U.S. patent application Ser. No. 13/666,912, filed on Nov. 1, 2012, titled "Impedance-based Adjustment of Power and Frequency", which claims the benefit of and priority, under 35 U.S.C. § 119(e), to U.S. Provisional Patent Application No. 61/701,560, filed on Sep. 14, 2012, and titled "Impedance-based Adjustment of Power and Frequency", all of which are incorporated by reference herein in their entirety for all purposes.

The U.S. patent application Ser. No. 13/666,912 is a continuation-in-part of and claims the benefit of and priority, under 35 U.S.C. § 120, to U.S. patent application Ser. No. 13/531,491, issued as U.S. Pat. No. 9,114,666, filed on Jun. 22, 2012, and titled "Methods and Apparatus For Controlling Plasma In A Plasma Processing System", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,041, and filed on Feb. 22, 2012, which is incorporated by reference herein in its entirety for all purposes.

The U.S. patent application Ser. No. 13/666,912 is a continuation-in-part of and claims the benefit of and priority, under 35 U.S.C. § 120, to U.S. patent application Ser. No. 13/550,719, filed on Jul. 17, 2012, titled "Methods and Apparatus For Synchronizing RF Pulses In A Plasma Processing System", and issued as U.S. Pat. No. 9,368,329, which is incorporated by reference herein in its entirety for all purposes.

The U.S. patent application Ser. No. 13/550,719 claims the benefit of and priority, under 35 U.S.C. § 119(e), to U.S. Provisional Patent Application No. 61/602,041, filed on Feb. 22, 2012, and titled "Frequency Enhanced Impedance Dependent Power Control For Multi-frequency Pulsing", which is incorporated by reference herein in its entirety for all purposes.

FIELD

The present embodiments relate to improving response time to a change in plasma impedance, and more particularly, apparatus, methods, and computer programs for adjustment of power and frequency based on three or more states.

BACKGROUND

In some plasma processing systems, multiple radio frequency (RF) signals are provided to one or more electrodes within a plasma chamber. The RF signals help generate plasma within the plasma chamber. The plasma is used for a variety of operations, e.g., clean substrate placed on a lower electrode, etch the substrate, etc.

It is in this context that embodiments described in the present disclosure arise.

SUMMARY

Embodiments of the disclosure provide apparatus, methods and computer programs for adjustment of power and frequency based on three or more states. It should be appreciated that the present embodiments can be implemented in numerous ways, e.g., a process, an apparatus, a system, a device, or a method on a computer readable medium. Several embodiments are described below.

In some embodiments, a plasma processing system is described. The plasma system includes a primary generator including three primary power controllers. Each of the primary power controllers is configured with a predefined power setting. The plasma system includes a secondary generator including three secondary power controllers. Each of the secondary power controllers is configured with a predefined power setting. The plasma system includes a control circuit interfaced as an input to each of the primary and secondary generators. The control circuit is configured to generate a pulsed signal, which is defined to include three states that define a cycle that repeats during operation for a plurality of cycles. Each state is defined to select a first, or a second or a third of the three primary power controllers while also selecting a first, or a second or a third of the three secondary power controllers.

In an embodiment, a plasma system that is configured to operate based on multiple states is described. The plasma system includes a primary radio frequency (RF) generator for receiving a pulsed signal. The pulsed signal has three or more states. The three or more states include a first state, a second state, and a third state. The primary RF generator is configured to couple to a plasma chamber via an impedance matching circuit. The plasma system further includes a secondary RF generator for receiving the pulsed signal. The secondary RF generator is configured to couple to the plasma chamber via the impedance matching circuit. Each of the primary RF generator and the secondary RF generator is configured to determine whether the pulsed signal is in the first state, or the second state, or the third state. The primary RF generator is configured to provide an RF signal having a first primary quantitative level to the impedance matching circuit in response to determining that the pulsed signal is in the first state. The secondary RF generator is configured to provide an RF signal having a first secondary quantitative level to the impedance matching circuit in response to determining that the pulsed signal is in the first state. The primary RF generator is configured to provide an RF signal having the first primary quantitative level to the impedance matching circuit in response to determining that the pulsed signal is in the second state. The secondary RF generator is configured to provide an RF signal having a second secondary quantitative level to the impedance matching circuit in response to determining that the pulsed signal is in the second state. The primary RF generator is configured to provide an RF signal having a second primary quantitative level to the impedance matching circuit in response to determining that the pulsed signal is in the third state. The secondary RF generator is configured to provide an RF signal having a third secondary quantitative level to the impedance matching circuit in response to determining that the pulsed signal is in the third state.

In several embodiments, a plasma system that is configured to operate based on multiple states is described. The plasma system includes a primary radio frequency (RF) generator for receiving a pulsed signal, which has three or more states. The three or more states include a first state, a second state, and a third state. The primary RF generator is configured to couple to a plasma chamber via an impedance matching circuit. The primary RF generator is configured to determine whether the pulsed signal is in the first state, or the second state, or the third state. The primary RF generator is configured to provide an RF signal having a first primary quantitative level to a plasma chamber to strike plasma in response to determining that the pulsed signal is in the first state, is configured to provide an RF signal having the first primary quantitative level to the plasma chamber in response to determining that the pulsed signal is in the second state, and is configured to provide an RF signal having a second primary quantitative level to the plasma chamber in response to determining that the pulsed signal is in the third state. The plasma system includes a secondary RF generator that is configured to couple to the plasma chamber via the impedance matching circuit. The secondary RF generator determines whether a parameter associated with the plasma exceeds a first threshold. The secondary RF generator is configured to provide an RF signal having a first secondary quantitative level in response to determining that the parameter associated with the plasma does not exceed the first threshold and is configured to provide an RF signal having a second secondary quantitative level in response to determining that the parameter associated with the plasma exceeds the first threshold.

In some embodiments, a plasma method includes receiving a pulsed signal. The operation of receiving the pulsed signal is performed by a primary processor. The plasma method further includes receiving the pulsed signal. The operation of receiving the pulsed signal is performed by a secondary processor. The method includes determining whether the pulsed signal is in the first state, or the second state, or the third state. The operation of determining whether the pulsed signal is in the first state, or the second state, or the third state is performed by the primary processor. The method includes determining whether the pulsed signal is in the first state, or the second state, or the third state. The operations of determining whether the pulsed signal is in the first state, or the second state, or the third state is performed by the secondary processor. The method further includes providing a first primary quantitative level of a first radio frequency (RF) signal to a primary power supply in response to determining that the pulsed signal is in the first state. The operation of providing the first primary quantitative level is performed by the primary processor. The method includes providing a first secondary quantitative level of a second RF signal to a secondary power supply in response to determining that the pulsed signal is in the first state. The operation of providing the first secondary quantitative level is performed by the secondary processor.

In these embodiments, the plasma method includes providing the first primary quantitative level of the first RF signal to the primary power supply in response to determining that the pulsed signal is in the second state. The operation of providing the first primary quantitative level is performed by the primary processor. The method includes providing a second secondary quantitative level of the second RF signal to the secondary power supply in response to determining that the pulsed signal is in the second state. The operation of providing the second secondary quantitative level is performed by the secondary processor. The method includes providing a second primary quantitative level of the first RF signal to the primary power supply in response to determining that the pulsed signal is in the third state. The operation of providing the second primary quantitative level is performed by the primary processor. The method includes providing a third secondary quantitative level of the second RF signal to the secondary power supply in response to determining that the pulsed signal is in the third state. The operation of providing the third secondary quantitative level is performed by the secondary processor.

Some advantages of the above-described embodiments include reducing a response time to respond to a change in plasma impedance within a plasma chamber. For example, when a pulsed signal, e.g., a transistor-transistor logic (TTL) signal, etc., is used to control frequency and/or power supplied by multiple RF power supplies, a first one of the RF supplies does not need time to respond to change in power and/or frequency of a second one of the RF supplies. Usually, when the frequency and/or power input to the first RF supply is changed, there is a change in plasma impedance and the first RF supply reacts to the change in the impedance. This reaction takes time, which negatively affects a process, e.g., etching, deposition, cleaning, etc., occurring within the plasma chamber. When the RF supplies react to a change in the state of the state signal with pre-determined frequencies and/or pre-determined power, the time to react to the change in plasma impedance is reduced. This reduction in time results in a reduction in time that used to negatively affect the process.

Some additional advantages of the above-described embodiments include providing an accurate power and/or frequency level to stabilize plasma, e.g., to reduce a difference between an impedance of a source and a load. The frequency and/or power level is accurate when the power and/or frequency level is generated based on a change in plasma impedance. For example, complex voltage and complex current are measured and are used to generate a change in plasma impedance. It is determined whether the change in plasma impedance exceeds a threshold and if so, the power and/or frequency level is changed to stabilize plasma.

Other advantages of embodiments include reducing an amount of time to achieve stability in plasma. A training routine is used to determine frequency and/or power levels to apply to a driver and amplifier system. The power and/or frequency levels correspond to a change in plasma impedance that is also determined during the training routine. The training routine saves time during production, e.g., time for cleaning substrates, time for processing substrates, time for etching substrates, time for deposition material on substrates, etc. For example, during production, when it is determined that the change in plasma impedance exceeds a threshold, the power and/or frequency levels are applied to a power supply without a need to tune the power and/or frequency levels.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for adjustment of power and frequency based on three or more states. It will be apparent that the present embodiments may be practiced without some or all of these specific details. In other instances, well known process operations have not been described in detail in order not to unnecessarily obscure the present embodiments.

Figure 1:
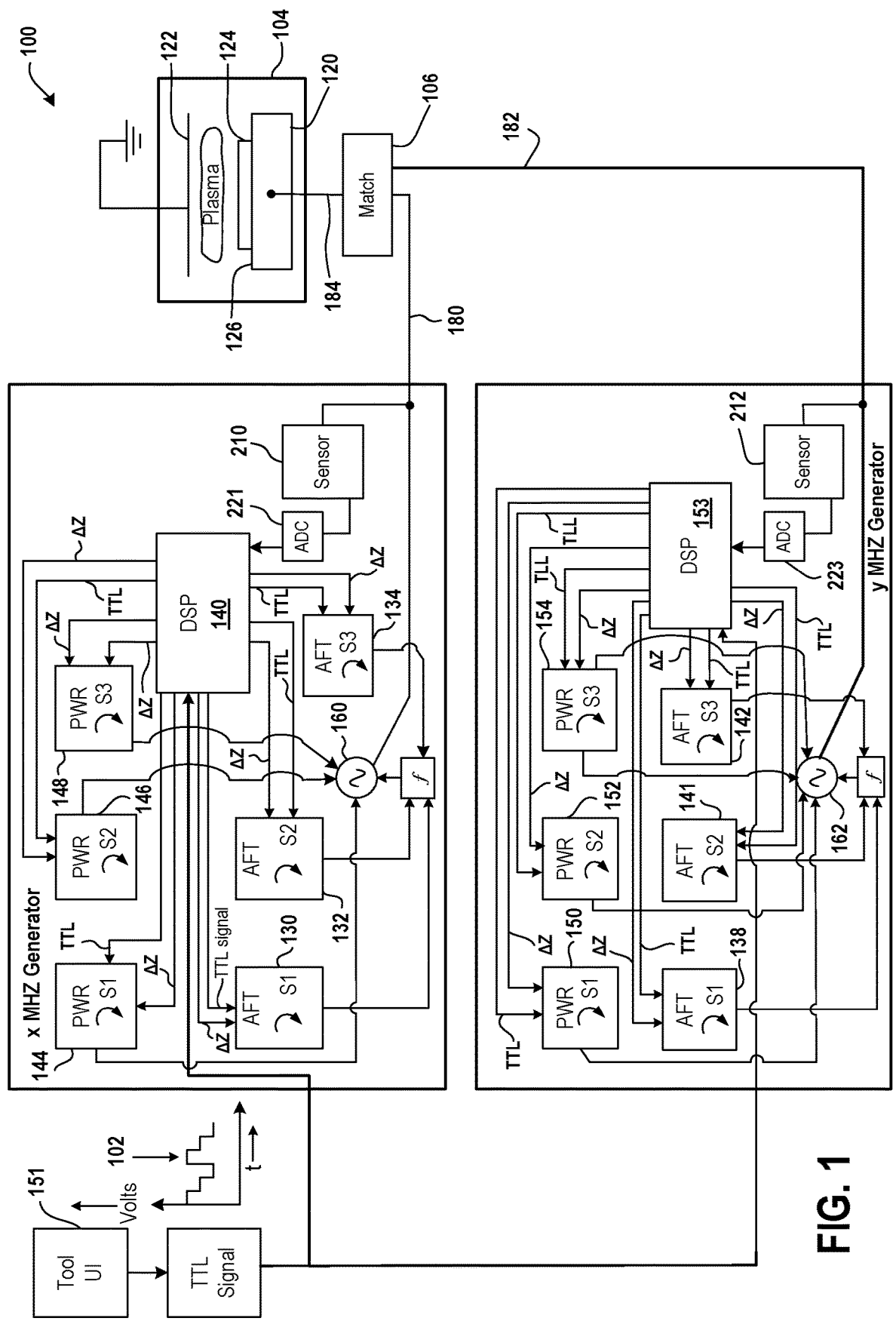
FIG. 1 is a block diagram of a system for adjusting power and/or frequency of a radio frequency (RF) generator based on multiple states of a pulsed signal, in accordance with an embodiment described in the present disclosure.

FIG. 1 is a block diagram of an embodiment of a system 100 for adjusting, during production, power and/or frequency of an RF generator based on multiple states of a pulsed signal 102. The system 100 includes an x megahertz (MHz) radio frequency (RF) power generator that generates an RF signal and the RF signal is supplied via an impedance matching circuit 106 to a lower electrode 120 of a plasma chamber 104. Similarly, a y MHz power supply generates an RF signal and supplies the RF signal via the impedance matching circuit 106 to the lower electrode 120.

Values of x may be 2, 27, or 60. Also, values of y may be 27, 60, or 2. For example, when x is 2, y is 27 or 60. As another example, when x is 27, y is 2 or 60. As yet another example, when x is 60, y is 2 or 27. Moreover, it should be noted that the values 2 MHz, 27 MHz, and 60 MHz are provided as examples and are not limiting. For example, instead of a 2 MHz RF generator, a 2.5 MHz RF generator may be used and instead of a 60 MHz RF generator, a 65 MHz RF generator may be used. In one embodiment, in addition to the 2 MHz RF generator and the 27 MHz RF generator, the 60 MHz RF generator is used to provide RF power to the lower electrode 120.

An impedance matching circuit includes electric circuit components, e.g., inductors, capacitors, etc. to match an impedance of a source coupled to the impedance matching circuit with an impedance of a load coupled to the impedance matching circuit. For example, the impedance matching circuit 106 matches an impedance of the x MHz RF generator and any components, e.g., an RF cable, etc., coupling the x MHz RF generator to the impedance matching circuit 106 with an impedance of the plasma chamber 104 and any components, e.g., an RF transmission line, etc., coupling the plasma chamber 104 to the impedance matching circuit 106. In one embodiment, an impedance matching circuit is tuned to facilitate a match between an impedance of a source coupled to the impedance matching circuit with that of a load coupled to the impedance matching circuit. An impedance match between a source and a load reduces chances of power being reflected from the load towards the source.

The plasma chamber 104 includes the lower electrode 120, an upper electrode 122, and other components (not shown), e.g., an upper dielectric ring surrounding the upper electrode 122, a lower electrode extension surrounding the upper dielectric ring, a lower dielectric ring surrounding the lower electrode, a lower dielectric ring surrounding the lower electrode 120, a lower electrode extension surrounding the lower electrode 120, an upper plasma exclusion zone (PEZ) ring, a lower PEZ ring, etc. The upper electrode 122 is located opposite to and facing the lower electrode 120.

A substrate 124, e.g., a semiconductor wafer, is supported on an upper surface 126 of the lower electrode 120. Integrated circuits, e.g., an application specific integrated circuit (ASIC), a programmable logic device (PLD), etc., are developed on the substrate 124 and the integrated circuits are used in a variety of devices, e.g., cell phones, tablets, smart phones, computers, laptops, networking equipment, etc. The lower electrode 120 is made of a metal, e.g., anodized aluminum, alloy of aluminum, etc. Also, the upper electrode 122 is made of a metal, e.g., aluminum, alloy of aluminum, etc.

In one embodiment, the upper electrode 122 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 122 is grounded. The lower electrode 120 is coupled to one or more RF generators via the impedance matching circuit 106. For example, the upper electrode 122 is coupled to the x MHz RF generator via the impedance matching circuit 106 and to the y MHz RF power supply via the impedance matching circuit 106.

When the process gas is supplied between the upper electrode 122 and the lower electrode 120 and when an RF generator, e.g., the x MHz RF generator and/or the y MHz RF generator, etc., supplies power via the impedance matching circuit 106 to the lower electrode 120, the process gas is ignited to generate plasma within the plasma chamber 104. For example, the 2 MHz RF generator supplies power via the impedance matching circuit 106 to ignite the process gas to generate plasma. In some embodiments, the 2 MHz RF generator is a master RF generator.

A tool user interface (UI) 151, e.g., a control circuit, etc., on a computer (not shown) is used to generate the pulsed signal 102, e.g., a transistor-transistor logic (TTL) signal, a digital pulsing signal, a clock signal, a signal with a duty cycle, etc. In one embodiment, the computer includes a TTL circuit. As used herein, instead of a computer, a processor, a controller, an ASIC or a PLD is used, and these terms are used interchangeably herein.

The pulsed signal 102 includes states S1, S2, and S3. In various embodiments, the states S1, S2, and S3 repeat in clock cycles. Each clock cycle includes the state S1, S2 and S3. For example, during a half period of a clock cycle, the states S1 and S2 are executed and during the remaining half period of the clock cycle, the state S3 is executed. As another example, during a third of a time period of a clock cycle, the state S1 is executed, during another third of the time period, the state S2 is executed, and during the remaining third of the time period, the state S3 is executed. In some embodiments, the pulsed signal 102 includes more or less than three states. An example of the state S1 includes a state having a first range of power levels. An example of the state S2 includes a state having a second range of power levels. As example of the third state S3 includes a state having a third range of power levels. In some embodiments, the second range of power levels is greater than the first range of power levels and the third range of power levels is greater than the second range of power levels. In various embodiments, the third range of power levels is lower than the second range of power levels and the second range of power levels is lower than the first range of power levels. In one embodiment, the third range of power levels is unequal to the second range of power levels and the second range of power levels is unequal to the first range of power levels.

In some embodiments, a range of power levels includes one or more power levels.

In various embodiments, instead of the computer, a clock source, e.g., a crystal oscillator, etc., is used to generate an analog clock signal, which is converted by an analog-to-digital converter into a digital signal similar to the pulsed signal 102. For example, a crystal oscillator is made to oscillate in an electric field by applying a voltage to an electrode near or on the crystal oscillator.

In some embodiments, two digital clock sources, e.g., processors, computers, etc., are used to generate the pulsed signal 102. A first clock signal of the first digital clock source has a state 1 and 0 and a second clock signal of the second digital clock source has a state 1 and 0. An adder, e.g., an addition circuit, etc., is coupled with the two clock sources to sum the first and second digital signals to generate the pulsed signal 102 with three states.

The pulsed signal 102 is sent to a digital signal processor (DSP) 140 of the x MHz RF generator and another DSP 153 of the y MHz RF generator. Each DSP 140 and 153 receives the pulsed signal 102 and identifies the states S1, S2, and S3 of the pulsed signal 102. For example, the DSP 140 distinguishes between the states S1, S2, and S3. To illustrate a manner in which the DSP 140 distinguishes between the states S1, S2, and S3, the DSP 140 determines that the pulsed signal 102 has the first range of power levels during a first time period, has the second range of power levels during a second time period, and has the third range of power levels during a third time period. It is pre-determined by the DSP 140 that the first range of power levels corresponds to the state S1, the second range of power levels corresponds to the state S2, and the third range of power levels corresponds to the state S3.

In some embodiments, the first time period is equal to each of the second time period and to the third time period. In various embodiments, the first time period is equal to the first time period or to the second time period. In one embodiment, the first time period is unequal to each of the first and second time periods. In various embodiments, the first time period is unequal to the first time period or the second time period.

Each DSP 140 and 153 stores the states S1, S2, and S3 in memory locations of one or more memory devices within the DSP. Examples of a memory device include a random access memory (RAM) and a read-only memory (ROM). A memory device may be a flash memory, a hard disk, a storage device, a computer-readable medium, etc.

In various embodiments, a correspondence between a range of power levels and a state of the pulsed signal 102 is stored in a memory device of a DSP. For example, a mapping between the first range of power levels and the state S1 is stored within a memory device of the DSP 140. As another example, a mapping between the second range of power levels and the state S2 is stored within a memory device of the DSP 153. As yet another example, a mapping between the third range of power levels and the state S3 is stored within the DSP 140.

Each DSP 140 and 153 provides the identified states S1, S2, and S3 from corresponding memory locations to corresponding auto frequency tuners (AFTs) 130, 132, 134, 138, 141, and 142, and to corresponding power controllers 144, 146, 148, 150, 152, and 154. For example, the DSP 140 indicates to the AFT 130 and the power controller 144 that the pulsed signal 102 is in the state S1 between times t1 and t2 of the first time period. As another example, the DSP 140 indicates to the AFT 132 and the power controller 146 that the pulsed signal 102 is in the state S2 between times t2 and t3 of the second time period. As yet another example, the DSP 140 indicates to the AFT 134 and the power controller 148 that the pulsed signal 102 is in the state S3 between times t3 and t4 of the third time period. As another example, the DSP 153 indicates to the AFT 138 and the power controller 150 that the pulsed signal 102 is in the state S1 between the times t1 and t2 of the first time period. As yet another example, the DSP 153 indicates to the AFT 141 and the power controller 152 that the pulsed signal 102 is in the state S2 between the times t2 and t3 of the second time period. As another example, the DSP 153 indicates to the AFT 142 and the power controller 154 that the pulsed signal 102 is in the state S3 between the times t3 and t4 of the third time period. In some embodiments, the terms tuner and controller are used interchangeably herein. An example of an AFT is provided in U.S. Pat. No. 6,020,794, which is incorporated by reference herein in its entirety.

Each AFT 130, 132, 134, 138, 141, and 142 determines a frequency level based on a state of the pulsed signal 102 and each power controller 144, 146, 148, 150, 152, and 154 determines a power level based on the state of the pulsed signal 102. For example, the AFT 130 determines that a frequency level Fp1 is to be provided to a power supply 160 of the x MHz RF generator when the state of the pulsed signal 102 is S1 and the power controller 144 determines that a power level Pp1 is to be provided to the power supply 160 when the state of the pulsed signal 102 is S1. As another example, the AFT 132 determines that a frequency level Fp2 is to be provided to the power supply 160 when the state of the pulsed signal 102 is S2 and the power controller 146 determines that a power level Pp2 is to be provided to the power supply 160 when the state of the pulsed signal 102 is S2. As yet another example, the AFT 134 determines that the frequency level Fp3 is to be provided to the power supply 160 when the state of the pulsed signal 102 is S3 and the power controller 148 determines that the power level Pp3 is to be provided to the power supply 160 when the state of the pulsed signal 102 is S3.

As another example, the AFT 138 determines that a frequency level Fs1 is to be provided to a power supply 162 of the y MHz RF generator when the state of the pulsed signal 102 is S1 and the power controller 150 determines that a power level Ps1 is to be provided to the power supply 162 when the state of the pulsed signal 102 is S1. As another example, the AFT 141 determines that a frequency level Fs2 is to be provided to the power supply 162 when the state of the pulsed signal 102 is S2 and the power controller 152 determines that a power level Ps2 is to be provided to the power supply 162 when the state of the pulsed signal 102 is S2. As yet another example, the AFT 142 determines that a frequency level Fs3 is to be provided to the power supply 162 when the state of the pulsed signal 102 is S3 and the power controller 154 determines that a power level Ps3 is to be provided to the power supply 162 when the state of the pulsed signal 102 is S3.

In several embodiments, a level includes one or more values. For example, a frequency level includes one or more frequency values and a power level includes one or more power values.

In some embodiments, the frequency levels Fp1, Fp2, and Fp3 are the same. In various embodiments, at least two of the frequency levels Fp1, Fp2, and Fp3 are unequal. For example, the frequency level Fp1 is unequal to the frequency level Fp2, which is unequal to the frequency level Fp3. In this example, the frequency level Fp3 is unequal to the frequency level Fp1. As another example, the frequency level Fp1 is unequal to the frequency level Fp2, which is equal to the frequency level Fp3.

Similarly, in several embodiments, the frequency levels Fs1, Fs2, and Fs3 are the same, or at least two of the frequency levels Fs1, Fs2, and Fs3 are unequal and the remaining frequency levels are equal, or at least two of the frequency levels Fs1, Fs2, and Fs3 are equal and the remaining frequency levels are unequal.

In various embodiments, the power levels Pp1, Pp2, and Pp3 are the same. For example, the power level Pp1 is equal to the power level Pp2, which is equal to the power level Pp3. In a number of embodiments, at least two of the power levels Pp1, Pp2, and Pp3 are unequal and the remaining power levels are equal. For example, the power level Pp1 is unequal to the power level Pp2, which is equal to the power level Pp3. As yet another example, the power level Pp2 is unequal to the power level Pp3, which is equal to the power level Pp1. As another example, the power level Pp1 is equal to the power level Pp2, which is unequal to the power level Pp3. In some embodiments, at least two of the power levels Pp1, Pp2, and Pp3 are equal and the remaining power levels are unequal.

Similarly, in some embodiments, the power levels Ps1, Ps2, and Ps3 are the same. In various embodiments, at least two of the power levels Ps1, Ps2, and Ps3 are unequal and the remaining power levels are equal. In several embodiments, at least two of the power levels Ps1, Ps2, and Ps3 are equal and the remaining power levels are unequal.

In one embodiment, the frequency level Fs1 and the power level Ps1 are generated based on a training routine. During the training routine, when the x MHz RF generator changes its RF power signal from a low power level to a high power level or from the low power level to the high power level, there is an impedance mismatch between one or more portions within the plasma chamber 104 and y MHz RF generator. The high power level is higher than the low power level. The x MHz RF generator changes its RF power signal when a state of the pulsed signal 102 supplied to the x MHz RF generator changes from S3 to S1. In this case, the y MHz RF generator has its frequency and power tuned when the x MHz RF generator starts supplying power at the high power level or at the low power level. To reduce the impedance mismatch, the y MHz RF generator starts tuning, e.g., converging, to a frequency level and to a power level. The achievement of convergence may be determined by the DSP 153 based on a standard deviation or another technique. To allow the y MHz RF generator more time to converge to the frequency level and the power level, the x MHz RF generator is kept at the high power level or the low power level for an extended period of time than a usual period of time. The usual period of time is an amount of time in which the impedance mismatch is not reduced, e.g., removed. When the y MHz RF generator converges to the frequency level and the power level, the converged frequency level is stored as the frequency level Fs1 within the AFT 138 and the converged power level is stored as the power level Ps1 within the power controller 150. Similarly, during the training routine, the frequency levels Fs2, Fs3, Fp1, Fp2, and Fp3, and the power levels Ps2, Ps3, Pp1, Pp2, and Pp3 are generated. The frequency level Fs2 is stored in the AFT 141, the frequency level Fs3 is stored in the AFT 142, the frequency level Fp1 is stored in the AFT 130, the frequency level Fp2 is stored in the AFT 132, the frequency level Fp3 is stored in the AFT 134, the power level Ps2 is stored in the power controller 152, and the power level Ps3 is stored in the power controller 154, the power level Pp1 is stored in the power controller 144, and the power level Pp2 is stored in the power controller 146, and the power level Pp3 is stored in the power controller 148.

When the state of the pulsed signal 102 is S1, the power controller 144 provides the power level Pp1 to the power supply 160 and the power controller 150 provides the power level Ps1 to the power supply 162. During the state S1, the AFT 130 provides the frequency level Fp1 to the power supply 160 and the AFT 138 provides the frequency level Fs1 to the power supply 162.

Moreover, in one embodiment, when the state of the pulsed signal 102 is S1, the power controller 146 does not supply the power level Pp2 to the power supply 160 and the power controller 148 does not supply the power level Pp3 to the power supply 160. Also, in this embodiment, the AFT 132 does not provide the frequency level of Fp2 to the power supply 160 and the AFT 134 does not provide the frequency level of Fp3 to the power supply 160. Also, when the state of the pulsed signal 102 is S1, the power controller 152 does not supply the power level Ps2 to the power supply 162 and the power controller 154 does not supply the power level Ps3 to the power supply 162. Furthermore, the AFT 141 does not provide the frequency level of Fs2 to the power supply 162 and the AFT 142 does not provide the frequency level of Fs3 to the power supply 162. In various embodiments, a non-supply of power level includes a supply of a power level of zero.

In some embodiments, during a state, a power level for the state is provided to the power supply 160 simultaneous with the provision of a power level for the state to the power supply 162. For example, during the state S1, the power level Pp1 is provided to the power supply 160 simultaneous with the provision of the power level Ps1 to the power supply 162. To further illustrate, in the state S1, the power level Pp1 is provided to the power supply 160 during the same clock edge of the pulsed signal 102 as that during which the power level Ps1 is provided to the power supply 162.

Similarly, in various embodiments, during a state, a frequency level for the state is provided to the power supply 160 simultaneous with the provision of a frequency level for the state to the power supply 162. For example, during the state S1, the frequency level Fp1 is provided to the power supply 160 simultaneous with the provision of the frequency level Fs1 to the power supply 162. To further illustrate, in the state S1, the frequency level Fp1 is provided to the power supply 160 during the same clock edge of the pulsed signal 102 as that during which the frequency level Fs1 is provided to the power supply 162.

In some embodiments, during a state, a power level for the state and a frequency level for the state is provided to the power supply 160 simultaneous with the provision of a power level for the state and a frequency level for the state to the power supply 162. For example, during the state S3, the frequency level Fp3 and the power level Pp3 are provided simultaneously to the power supply 160 simultaneous with the provision of the frequency level Fs3 and the power level Ps3 to the power supply 162. To further illustrate, in the state S1, the frequency level Fp3 and the power level Pp3 are provided to the power supply 160 during the same clock edge of the pulsed signal 102 as that during which the frequency level Fs3 and the power level Ps3 are provided to the power supply 162.

In several embodiments, during a state, a power level is provided by a power controller of the x MHz RF generator to the power supply 160 of the x MHz RF generator at almost the same time as that of the provision of a power level by a power controller of the y MHz RF generator to the power supply 162 of the y MHz RF generator. For example, during the state S1, the power level of Pp1 is provided to the power supply 160 at almost the same time as that of the provision of the power level Ps1 to the power supply 162. To further illustrate, in the state S1, the power level of Pp1 is provided to the power supply 160 within a fraction of a second, e.g., microseconds, milliseconds, nanoseconds, etc., before or after an occurrence of a clock edge of the pulsed signal 102. In this example, the power level Ps1 is provided to the power supply 162 during the occurrence of the clock edge.

Similarly, in some embodiments, during a state, a frequency level is provided by an AFT of the x MHz RF generator to the power supply 160 of the x MHz RF generator at almost the same time as that of the provision of a frequency level by an AFT of the y MHz RF generator to the power supply 162 of the y MHz RF generator. For example, during the state S2, the frequency level of Fp2 is provided to the power supply 160 at almost the same time as that of the provision of the frequency level Fs2 to the power supply 162. To further illustrate, in the state S2, the frequency level of Fp2 is provided to the power supply 160 within a fraction of a second before or after an occurrence of a clock edge of the pulsed signal 102. In this example, the power level Fs2 is provided to the power supply 162 during the occurrence of the clock edge.

Similarly, in various embodiments, during a state, a frequency level is provided by a tuner of the x MHz RF generator and a power level is provided by a power controller of the x MHz RF generator to the power supply 160 of the x MHz RF generator at almost the same time as a frequency level is provided by a tuner of the y MHz RF generator and a power level is provided by a power controller of the y MHz RF generator to the power supply 162 of the y MHz RF generator. For example, during the state S3, the frequency level of Fp3 and the power level of Pp3 are provided to the power supply 160 at almost the same time as that of the provision of the frequency level Fs3 and the power level Ps3 to the power supply 162. To further illustrate, in the state S3, the frequency level Fp3 and the power level Pp3 are provided to the power supply 160 within a fraction of a second before or after an occurrence of a clock edge of the pulsed signal 102. In this example, the power level Ps3 and the frequency level Fs3 are provided to the power supply 162 during the occurrence of the clock edge.

The power supply 160 receives the frequency level of Fp1 and the power level Pp1 during the state S1. Upon receiving the levels Fp1 and Pp1, the power supply 160 generates RF power at the frequency level Fp1 and the RF power has the power level of Pp1. Moreover, the power supply 162 receives the frequency level Fs1 and the power level Ps1 during the state S1. Upon receiving the levels Fs1 and Ps1, the power supply 162 of the y MHz RF generator generates an RF signal having the frequency level Fs1 and the power level Ps1.

Moreover, in one embodiment, when the state of the pulsed signal 102 is S2, the power controller 144 does not supply the power level Pp1 to the power supply 160 and the power controller 148 does not supply the power level Pp3 to the power supply 160. Also, in this embodiment, the AFT 130 does not provide the frequency level of Fp1 to the power supply 160 and the AFT 134 does not provide the frequency level of Fp3 to the power supply 160. Also, when the state of the pulsed signal 102 is S2, the power controller 150 does not supply the power level Ps1 to the power supply 162 and the power controller 154 does not supply the power level Ps3 to the power supply 162. Furthermore, during the state S2 of the pulsed signal 102, the AFT 138 does not provide the frequency level of Fs1 to the power supply 162 and the AFT 142 does not provide the frequency level of Fs3 to the power supply 162.

Moreover, the power supply 160 receives the frequency level of Fp2 and the power level Pp2 during the state S2. Upon receiving the levels Fp2 and Pp2, the power supply 160 generates RF power at the frequency level Fp2 and the RF power has the power level of Pp2. Moreover, the power supply 162 receives the frequency level Fs2 and the power level Ps2 during the state S2. Upon receiving the levels Fs2 and Ps2, the power supply 162 of the y MHz RF generator generates an RF signal having the frequency level Fs2 and the power level Ps2.

Also, in one embodiment, when the state of the pulsed signal 102 is S3, the power controller 144 does not supply the power level Pp1 to the power supply 160 and the power controller 146 does not supply the power level Pp2 to the power supply 160. Also, in this embodiment, the AFT 130 does not provide the frequency level of Fp1 to the power supply 160 and the AFT 132 does not provide the frequency level of Fp2 to the power supply 160. Also, when the state of the pulsed signal 102 is S3, the power controller 150 does not supply the power level Ps1 to the power supply 162 and the power controller 152 does not supply the power level Ps2 to the power supply 162. Furthermore, the AFT 138 does not provide the frequency level of Fs1 to the power supply 162 and the AFT 141 does not provide the frequency level of Fs2 to the power supply 162.

Furthermore, the power supply 160 receives the frequency level of Fp3 and the power level Pp3 during the state S3. Upon receiving the levels Fp3 and Pp3, the power supply 160 generates an RF signal having the frequency level Fp3 and the RF power level Pp3. Moreover, the power supply 162 receives the frequency level Fs3 and the power level Ps3 during the state S3. Upon receiving the levels Fs3 and Ps3, the power supply 162 of the y MHz RF generator generates an RF signal having the frequency level Fs3 and the power level Ps3.

In one embodiment, during a state, the non-provision of power levels to the power supply 160 for the remaining states is performed simultaneously with the non-provision of power levels for the remaining states to the power supply 162. For example, in the state S1, there is no provision of a power level by the power controller 146 to the power supply 160 during the same edge of the pulsed signal 102 as that of the non-provision of a power level by the power controller 152 to the power supply 162. As another example, in the state S2, there is no provision of power levels by the power controllers 144 and 148 to the power supply 160 during the same edge of the pulsed signal 102 as that of the non-provision of power levels by the power controllers 150 and 154 to the power supply 162. As yet another example, in the state S3, there is no provision of power levels by the power controllers 144 and 146 to the power supply 160 during the same edge of the pulsed signal 102 as that of the non-provision of power levels by the power controllers 150 and 152 to the power supply 162.

In some embodiments, during a state, the non-provision of frequency levels to the power supply 160 for the remaining states is performed simultaneous with the non-provision of frequency levels for the remaining states to the power supply 162. For example, in the state S1, there is no provision of a frequency level by the AFT 132 to the power supply 160 during the same edge of the pulsed signal 102 as that of the non-provision of a frequency level by the AFT 141 to the power supply 162. As another example, in the state S2, there is no provision of frequency levels by the AFTs 130 and 134 to the power supply 160 during the same edge of the pulsed signal 102 as that of the non-provision of frequency levels by the AFTs 138 and 142 to the power supply 162. As yet another example, in the state S3, there is no provision of frequency levels by the AFTs 130 and 132 to the power supply 160 during the same edge of the pulsed signal 102 as that of the non-provision of frequency levels by the AFTs 138 and 141 to the power supply 162.

In several embodiments, during a state, the non-provision of frequency and power levels to the power supply 160 for the remaining states is performed simultaneous with the non-provision of frequency and power levels for the remaining states to the power supply 162. For example, in the state S1, there is no provision of a frequency level by the AFT 132 and no provision of a power level by the power controller 146 to the power supply 160 during the same edge of the pulsed signal 102 as that of the non-provision of a frequency level by the AFT 141 and a non-provision of a power level by the power controller 152 to the power supply 162.

In some embodiments, during a state, the non-provision of power levels to the power supply 160 for the remaining states is performed at almost the same time as that of the non-provision of power levels for the remaining states to the power supply 162. In various embodiments, during a state, the non-provision of frequency levels to the power supply 160 for the remaining states is performed at almost the same time as the non-provision of frequency levels for the remaining states to the power supply 162. In several embodiments, during a state, the non-provision of frequency and power levels to the power supply 160 for the remaining states is performed at almost the same time as the non-provision of frequency and power levels for the remaining states to the power supply 162.

In some embodiments, a power supply, e.g., an RF power supply, etc., includes a driver coupled to an amplifier. The driver generates an RF signal. The amplifier amplifies the RF signal and supplies forward power of the RF signal via an RF cable, the impedance matching circuit 106 and the RF transmission line 184 to the plasma chamber 104. For example, during the state S1, the amplifier of the power supply 160 supplies forward power having a power level that is proportional, e.g., same as, multiple of, etc. of the power level Pp1 and having the frequency level Fp1 via the RF cable 180, the impedance matching circuit 106, and an RF transmission line 184 to the plasma chamber 104. In this example, during the state S1, the amplifier of the power supply 162 supplies forward power having a power level that is proportional to the power level Ps1 and having the frequency level Fs1 via the RF cable 182, the impedance matching circuit 106, and the RF transmission line 184 to the plasma chamber 104.

As another example, during the state S2, the amplifier of the power supply 160 supplies forward power having a power level that is proportional, e.g., same as, multiple of, etc. of the power level Pp2 and having the frequency level Fp2 via the RF cable 180, the impedance matching circuit 106, and the RF transmission line 184 to the plasma chamber 104. In this example, during the state S2, the amplifier of the power supply 162 supplies forward power having a power level that is proportional to the power level Ps2 and having the frequency level Fs2 via the RF cable 182, the impedance matching circuit 106, and the RF transmission line 184 to the plasma chamber 104. As yet another example, during the state S3, the amplifier of the power supply 160 supplies forward power having a power level that is proportional, e.g., same as, multiple of, etc. of the power level Pp3 and having the frequency level Fp3 via the RF cable 180, the impedance matching circuit 106, and the RF transmission line 184 to the plasma chamber 104. In this example, during the state S3, the amplifier of the power supply 162 supplies forward power having a power level that is proportional to the power level Ps3 and having the frequency level Fs3 via the RF cable 182, the impedance matching circuit 106, and the RF transmission line 184 to the plasma chamber 104.

In one embodiment, during each state S1, S2, and S3, a sensor 210 of the x MHz RF generator senses reflected power, which is RF power reflected from the plasma of the plasma chamber 104, on the RF cable 180. Moreover, during each state S1, S2, and S3, the sensor 210 senses forward power on the RF cable 180 when the forward power is sent from the x MHz RF generator via the RF cable 180 to the plasma chamber 104. Similarly, during each state S1, S2, and S3, a sensor 212 of the y MHz RF generator senses reflected power from the plasma of the plasma chamber 104. The reflected power sensed by the sensor 212 is reflected on the RF cable 182 from the plasma of the plasma chamber 104. Moreover, during each state S1, S2, and S3, the sensor 212 senses forward power on the RF cable 182 when the forward power is sent from the y MHz RF generator via the RF cable 182 to the plasma chamber 104.

An analog-to-digital converter (ADC) 221 of the x MHz RF generator converts the reflected power signals and the forward power signals sensed by the sensor 210 from an analog form to a digital form and an ADC 223 of the y MHz RF generator converts the reflected power signals and the forward power signals sensed by the sensor 212 from an analog to a digital form. During each state S1, S2, and S3, the DSP 140 receives a digital value, e.g., a magnitude, a phase, or a combination thereof, etc., of the reflected power signal and a digital value of the forward power signal sensed by the sensor 210 and the DSP 153 receives a digital value of the reflected power signal and a digital value of the forward power signal sensed by the sensor 212.

In some embodiments, a digital value of a power signal is a voltage of the power signal, a current of the signal, or a combination of the voltage and current. In various embodiments, a digital value of a signal includes a magnitude of the signal and a phase of the signal.

The DSP 140 calculates a parametric value, e.g., a ratio of the digital reflected power signal and the digital forward power signal, or a voltage standing wave ratio (VSWR), or a gamma value, or a change in impedance, etc., during one or all of the states S1, S2, and S3 from the digital values of the forward and reflected power signals on the RF cable 180. In some embodiments, a gamma value of 1 indicates a high degree of mismatch between impedances of a source and a load and a gamma value of 0 indicates a low degree of mismatch between impedances of a source and a load. Similarly, the DSP 153 calculates a parametric value from digital values of forward and reflected power signals on the RF cable 182. In various embodiments, a VSWR is calculated as being equal to a ratio of RC−1 and RC+1, where RC is a reflection coefficient.

In some embodiments, a sensor of an RF generator is a voltage and current probe that measures a complex current and a complex voltage that is transferred via an RF cable between the RF generator and the impedance matching circuit 106. For example, the sensor 210 is a voltage and current probe that measures a complex voltage and a complex current that is transferred via the RF cable 180 between the x MHz RF generator and the impedance matching circuit 106. As another example, the sensor 212 is a voltage and current probe that measures a complex voltage and a complex current that is transferred via the RF cable 182 between the y MHz RF generator and the impedance matching circuit 106. In these embodiments, a parametric value that is measured by a sensor includes an impedance of plasma or a change in impedance of plasma. The impedance of plasma is determined by a sensor as a ratio of the complex voltage to the complex current. The change in impedance is determined as a difference between two impedances of plasma over time. In some embodiments, a parametric value is determined by an AFT, a power controller, or a DSP of an RF generator.

A parametric value for a state is sent from a DSP of an RF generator to an AFT, within the RF generator, associated with the state. For example, a parametric value obtained during the state S1 is sent from the DSP 140 to the AFT 130 and a parametric value obtained during the state S1 is sent from the DSP 153 to the AFT 138. As another example, a parametric value obtained during the state S2 is sent from the DSP 140 to the AFT 132 and a parametric value obtained during the state S2 is sent from the DSP 153 to the AFT 141. As yet another example, a parametric value obtained during the state S3 is sent from the DSP 140 to the AFT 134 and a parametric value obtained during the state S3 is sent from the DSP 153 to the AFT 142.

During a state, an AFT of an RF generator receives a parametric value from a DSP, during the state, of the RF generator and the AFT determines a frequency level associated with the received parametric value. For example, during the state S1, the AFT 130 determines a frequency level associated with a parametric value received from the DSP 140 during the state S1 and the AFT 138 determines a frequency level based on a parametric value during the state S1 received from the DSP 153. As another example, during the state S2, the AFT 132 determines a frequency level corresponding to a parametric value received from the DSP 140 during the state S2 and the AFT 141 determines a frequency level based on a parametric value during the state S2 received from the DSP 153. As yet another example, during the state S3, the AFT 134 determines a frequency level associated with a parametric value received from the DSP 140 during the state S3 and the AFT 142 determines a frequency level based on a parametric value during the state S3 received from the DSP 153.

It should be noted that an association, e.g., correspondence, mapping, link, etc., between a parametric value and a frequency level is pre-determined and stored within an AFT. Similarly, in some embodiments, an association between a parametric value and a power level is pre-determined and stored within a power controller.

Moreover, during a state, an AFT of an RF generator adjusts a frequency level based on a frequency level that is generated from a parametric value for the state and provides the adjusted frequency level to a power supply of the RF generator. For example, during the state S1, the AFT 130 adjusts the frequency level Fp1 based on a frequency level associated with a parametric value generated by the DSP 140 for the state S1 and provides the adjusted frequency level to the power supply 160. Moreover, in this example, during the state S1, the AFT 138 adjusts the frequency level Fs1 based on a frequency level corresponding to a parametric value generated by the DSP 153 for the state S1 and provides the adjusted frequency level to the power supply 162. As another example, during the state S2, the AFT 132 adjusts the frequency level Fp2 based on a frequency level associated with a parametric value generated by the DSP 140 for the state S2 and provides the adjusted frequency level to the power supply 160. Moreover, in this example, during the state S2, the AFT 141 adjusts the frequency level Fs2 based on a frequency level associated with a parametric value that is generated by the DSP 153 for the state S2 and provides the adjusted frequency level to the power supply 162. As yet another example, during the state S3, the AFT 134 adjusts the frequency level Fp3 based on a frequency level associated with a parametric value generated by the DSP 140 for the state S3 and provides the adjusted frequency level to the power supply 160. Moreover, in this example, during the state S3, the AFT 142 adjusts the frequency level Fs3 based on a frequency level associated with a parametric value that is generated by the DSP 153 for the state S3 and provides the adjusted frequency level to the power supply 162.

Furthermore, during a state, a power controller of an RF generator determines a power level based on a parametric value received from a DSP of the RF generator. For example, during the state S1, the power controller 144 determines a power level based on a parametric value received from the DSP 140 and the power controller 150 determines a power level based on a parametric value received from the DSP 153. As another example, during the state S2, the power controller 146 determines a power level based on a parametric value received from the DSP 140 and the power controller 152 determines a power level based on a parametric value received from the DSP 153. As yet another example, during the state S3, the power controller 148 determines a power level based on a parametric value received from the DSP 140 and the power controller 154 determines a power level based on a parametric value received from the DSP 153.

Moreover, during a state, a power controller of an RF generator adjusts a power level of a power supply of the RF generator based on a power level that is generated based on a parametric value and provides the adjusted power level to the power supply. For example, during the state S1, the power controller 144 adjusts the power level of Pp1 based on a power level that is generated from a parametric value for the state S1 and provides the adjusted power level to the power supply 160. In this example, during the state S1, the power controller 150 adjusts the power level of Ps1 based on a power level that is generated from a parametric value for the state S1 and provides the adjusted power level to the power supply 162. As another example, during the state S2, the power controller 146 adjusts the power level of Pp2 based on a power level that is generated from a parametric value for the state S2 and provides the adjusted power level to the power supply 160. In this example, during the state S2, the power controller 152 adjusts the power level of Ps2 based on a power level that is generated from a parametric value for the state S2 and provides the adjusted power level to the power supply 162. As yet another example, during the state S3, the power controller 148 adjusts the power level of Pp3 based on a power level that is generated from a parametric value for the state S3 and provides the adjusted power level to the power supply 160. In this example, during the state S3, the power controller 154 adjusts the power level of Ps3 based on a power level that is generated from a parametric value for the state S3 and provides the adjusted power level to the power supply 162.

During a state, a power supply of an RF generator generates a power RF signal having an adjusted frequency level for the state received from an AFT of the RF generator and having an adjusted power level for the state received from a power controller of the RF generator, and supplies the power signal via a corresponding RF cable, the impedance matching circuit 106, and the RF transmission line 184 to the plasma chamber 104. For example, during the state S1, the power supply 160 generates a power signal having the adjusted frequency level received from the AFT 130 and having the adjusted power level received from the power controller 144, and supplies the power signal via the RF cable 180, the impedance matching circuit 106, and the RF transmission line 184 to the plasma chamber 104. Similarly, in this example, during the state S1, the power supply 162 generates a power signal having the adjusted frequency level received from the AFT 138 and having the adjusted power level received from the power controller 150, and supplies the power signal via the RF cable 182, the impedance matching circuit 106, and the RF transmission line 184 to the plasma chamber 104.

As another example, during the state S2, the power supply 160 generates a power signal having the adjusted frequency level received from the AFT 132 and having the adjusted power level received from the power controller 146, and supplies the power signal via the RF cable 180, the impedance matching circuit 106, and the RF transmission line 184 to the plasma chamber 104. Similarly, in this example, during the state S2, the power supply 162 generates a power signal having the adjusted frequency level received from the AFT 141 and having the adjusted power level received from the power controller 152, and supplies the power signal via the RF cable 182, the impedance matching circuit 106, and the RF transmission line 184 to the plasma chamber 104.

As yet another example, during the state S3, the power supply 160 generates a power signal having the adjusted frequency level received from the AFT 134 and having the adjusted power level received from the power controller 148, and supplies the power signal via the RF cable 180, the impedance matching circuit 106, and the RF transmission line 184 to the plasma chamber 104. Similarly, in this example, during the state S3, the power supply 162 generates a power signal having the adjusted frequency level received from the AFT 142 and having the adjusted power level received from the power controller 154, and supplies the power signal via the RF cable 182, the impedance matching circuit 106, and the RF transmission line 184 to the plasma chamber 104.

In an embodiment, a single controller is used instead of the power controller 144 and the AFT 130, a single controller is used instead of the power controller 146 and the AFT 132, and a single controller is used instead of the power controller 148 and the AFT 134. In some embodiments, a single controller is used instead of the power controller 150 and the AFT 138, a single controller is used instead of the power controller 152 and the AFT 141, and a single controller is used instead of the power controller 154 and the AFT 142.

In some embodiments, the z MHz RF generator is used in addition to the x and y MHz RF generators in the system 100. The z MHz RF generator may be a 60 MHz RF generator when the x MHz RF generator is a 2 MHz RF generator and the y MHz RF generator is a 27 MHz RF generator. The z MHz RF generator has similar structure as that of the x or y MHz RF generator and has similar connections as those of the x or y MHz RF generator with components of the system 100 outside the x or y MHz RF generator. For example, the z MHz RF generator includes three power controllers, three AFTs, a DSP, an ADC, a sensor, and a power supply. As another example, the DSP of the z MHz RF generator is coupled with the Tool UI 151 to receive the pulsed signal 102. As another example, the power supply of the z MHz RF generator is coupled to the lower electrode 120 of the plasma chamber 104 via an RF cable (not shown), the impedance matching circuit 106, and the RF transmission line 184.

It should be noted that the embodiments described herein are described using three states. In some embodiments, more than three states may be used.

Figure 2:
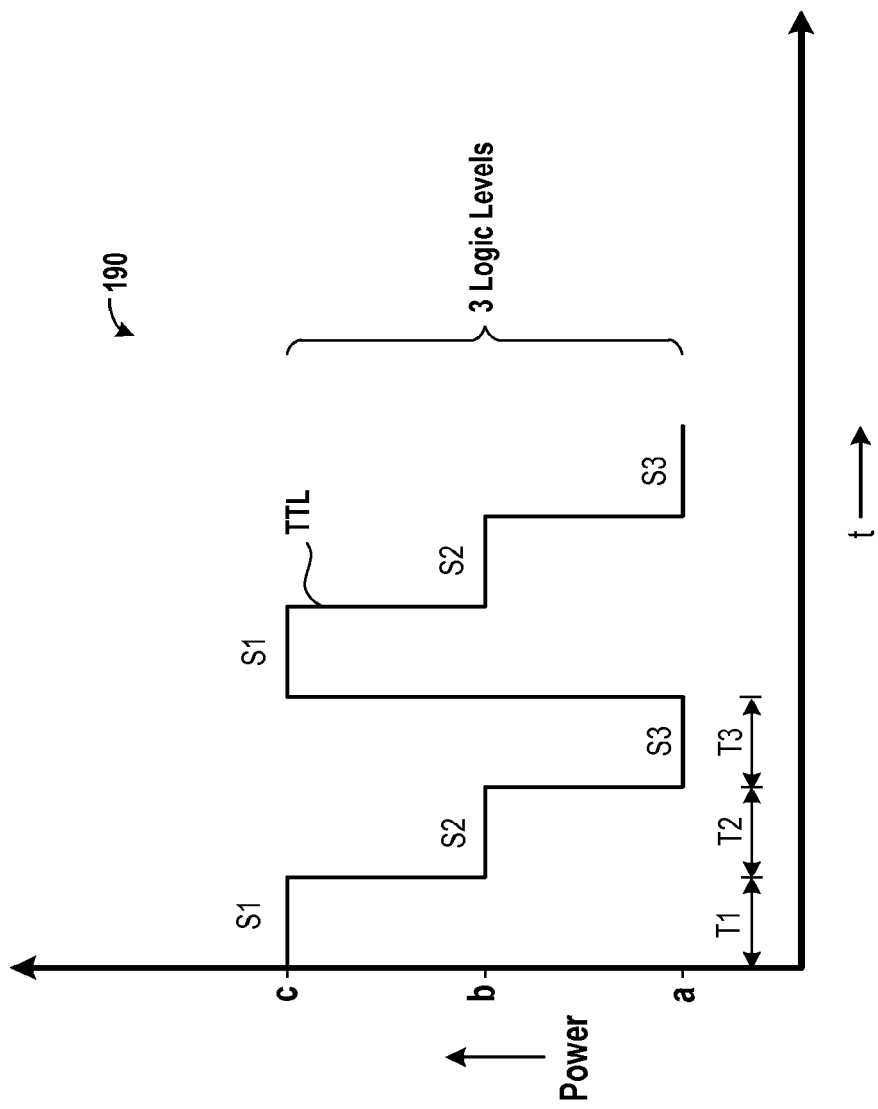
FIG. 2 is a graph that illustrates states S1, S2, and S3, in accordance with an embodiment described in the present disclosure.

FIG. 2 is an embodiment of a graph 190 that illustrates the states S1, S2, and S3. The graph 190 plots power versus time t. Each state S1, S2, or S3 is associated with a logic level. For example, the state S1 has a high logic level, the state S2 has a medium logic level, and the state S3 has a low logic level. The high logic level 'c' has a higher power level than the medium logic level b', which has a higher power level than the low logic level 'a'. As an example, the state S1 has the low, medium, or high logic level. As an example, the state S2 has the low, medium, or high logic level. As an example, the state S3 has the low, medium, or high logic level. In some embodiments, the states S1, S2, and S3 represent a step function.

Each state S1, S2, or S3 lasts for an equal time period. For example, a time period T1 of occurrence of the state S1 is the same as a time period T2 of occurrence of the state S2 or a time period T3 of occurrence of the state S3. In some embodiments, a state lasts for an unequal time compared to one or more of remaining states. For example, the state S1 lasts for a different time period than the state S2, which lasts for a different time period than the state S3. In this example, the time period of the state S3 may be the same as or different from the time period of the state S1. As another example, the state S1 lasts for a longer time period than the state S2, which lasts for a shorter time period than the state S3.

Figure 3:
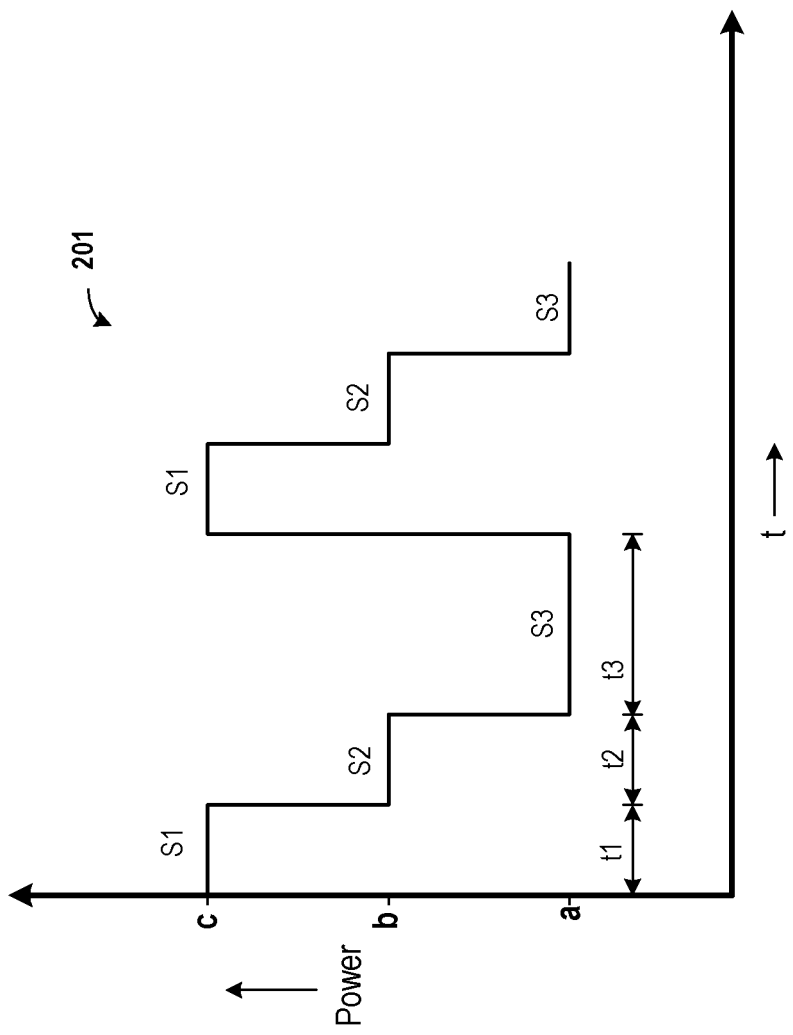
FIG. 3 is a diagram of a graph that illustrates different time periods for different states, in accordance with an embodiment described in the present disclosure.

FIG. 3 is a diagram of an embodiment of a graph 201 that illustrates different time periods for different states. The graph 201 plots power versus time. The states S1 and S2 occur for the same time periods and the state S3 occurs for a different time period than the time period for the state S2 or S3. For example, the state S1 occurs for a time period t1, the state S2 occurs for a time period t2, and the state S3 occurs for a time period t3. The time period t3 is longer than the time period t1 or t2.

In some embodiments, any two of the states S1, S2, and S3 occur for the same time period and the remaining state occurs for a different time period. For example, the state S1 occurs for the same time period as that of occurrence of the state S3 and the time period of occurrence is different from that of the state S2. As another example, the state S2 occurs for the same time period as that of occurrence of the state S3 and the time period of occurrence is different from that of the state S1.

Figure 4:
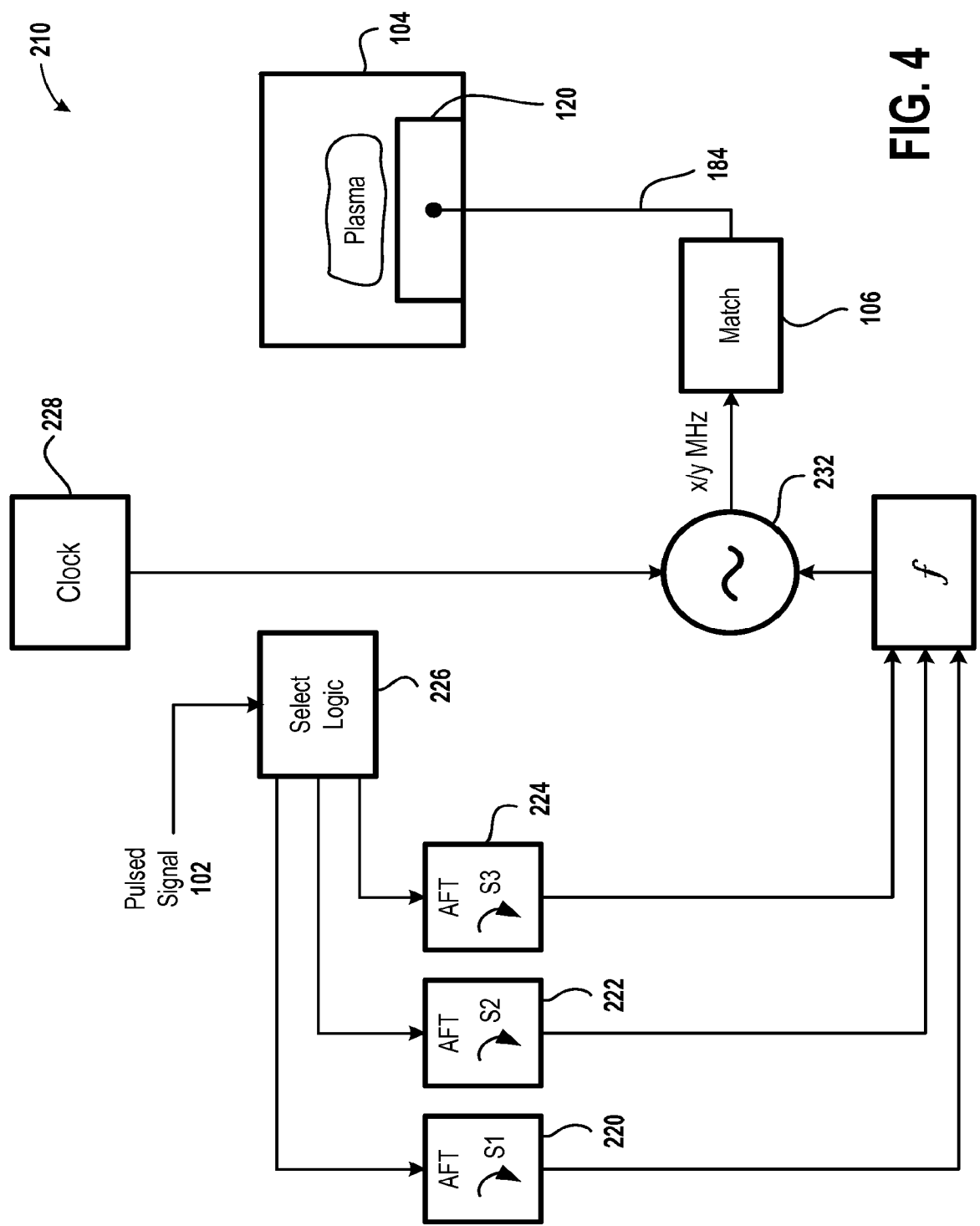
FIG. 4 is a diagram of a system for selecting one of auto frequency tuners (AFTs) based on a state of the pulsed signal, in accordance with an embodiment described in the present disclosure.

FIG. 4 is a diagram of an embodiment of a system 210 for selecting, during production, one of AFTs 220, 222, or 224 based on a state of the pulsed signal 102. The system 210 includes a select logic 226, the AFTs 220, 222, and 224, a digital clock source 228, the plasma chamber 104, the impedance matching circuit 106, and a power supply 232.

The select logic 226, the AFTs 220, 222, and 224, and the power supply 232 are implemented within the x MHz RF generator or the y MHz RF generator. When the AFTs 220, 222, and 224 are implemented within the x MHz RF generator, the AFT 220 is an example of the AFT 130, the AFT 222 is an example of the AFT 132, the AFT 224 is an example of the AFT 134, and the power supply 232 is an example of the power supply 160 (FIG. 1). Similarly, when the AFTs 220, 222, and 224 are implemented within the y MHz RF generator, the AFT 220 is an example of the AFT 138, the AFT 222 is an example of the AFT 141, the AFT 224 is an example of the AFT 142, and the power supply 232 is an example of the power supply 162 (FIG. 1).

Examples of the select logic 226 include a multiplexer. When the select logic 226 includes the multiplexer, the pulsed signal 102 is received at select inputs of the multiplexer.

In various embodiments, the select logic 226 includes a processor. In an embodiment, the select logic 226 is implemented within the DSP 140 or the DSP 153.

The digital clock source 228 is used to operate the power supply 232 synchronous with a digital clock signal generated by the digital clock source 228. In some embodiments, the digital clock signal is synchronous with the pulsed signal 102. For example, the digital clock signal has the same phase as that of the pulsed signal 102. As another example, a phase of the digital clock signal is within a pre-determined phase range of a phase of the pulsed signal 102. To illustrate the application of the pre-determined phase range, a leading edge of the digital clock signal of the clock source 228 is a fraction of second behind or before a leading edge of the pulsed signal 102.

In one embodiment, instead of the digital clock signal from the clock source 228, the pulsed signal 102 is provided to the power supply 232.

When the pulsed signal 102 is in the state S1, the select logic 226 selects the AFT 220. Similarly, when the pulsed signal 102 is in the state S2, the select logic 226 selects the AFT 222 and when the pulsed signal 102 is in the state S3, the select logic 226 selects the AFT 224. When the AFT 220 is selected, the AFT 220 provides the frequency level Fp1 to the power supply 232. Similarly, when the AFT 222 is selected, the AFT 222 provides the frequency level Fp2 to the power supply 232 and when the AFT 224 is selected, the AFT 224 provides the frequency level Fp3 to the power supply 232.

In embodiments in which the AFTs 220, 222, and 224 are located within the y MHz RF generator, when the AFT 220 is selected, the AFT 220 provides the frequency level Fs1 to the power supply 232. Similarly, in these embodiments, when the AFT 222 is selected, the AFT 222 provides the frequency level Fs2 to the power supply 232 and when the AFT 224 is elected, the AFT 224 provides the frequency level Fs3 to the power supply 232

In some embodiments, the select logic 226 selects between power controllers instead of the AFTs 220, 222, and 224. For example, the select logic 226 is coupled to the power controllers 144, 146, and 148 of the x MHz RF generator (FIG. 1). In this example, the select logic 226 selects the power controller 144 when the pulsed signal 102 is in the state S1, selects the power controller 146 when the pulsed signal 102 is in the state S2, and selects the power controller 148 when the pulsed signal 102 is in the state S3. As another example, the select logic 226 is coupled to the power controllers 150, 152, and 154 of the y MHz RF generator (FIG. 1). In this example, the select logic 226 selects the power controller 150 when the pulsed signal 102 is in the state S1, selects the power controller 152 when the pulsed signal 102 is in the state S2, and selects the power controller 154 when the pulsed signal 102 is in the state S3.

In various embodiments, when the power controller 144 of the x MHz RF generator is selected during the state S1, the power controller 144 provides the power level Pp1 to the power supply 232 and when the power controller 146 of the x MHz RF generator is selected during the state S2, the power controller 146 provides the power level Pp2 to the power supply 232. Moreover, when the power controller 148 of the x MHz RF generator is selected during the state S3, the power controller 148 provides the power level Pp3 to the power supply 232.

Similarly, in some embodiments, when the power controller 150 of the y MHz RF generator is selected during the state S1, the power controller 150 provides the power level Ps1 to the power supply 232 and when the power controller 152 of the y MHz RF generator is selected during the state S2, the power controller 152 provides the power level Ps2 to the power supply 232. Moreover, when the power controller 154 of the y MHz RF generator is selected during the state S3, the power controller 154 provides the power level Ps3 to the power supply 232.

In a number of embodiments, the select logic 226 is implemented within the z MHz RF generator and functions in a similar manner as that described herein. For example, the select logic 226 selects between AFTs of the z MHz RF generator or between power controllers of the z MHz RF generator based on a state of the pulsed signal 102.

Figure 5:
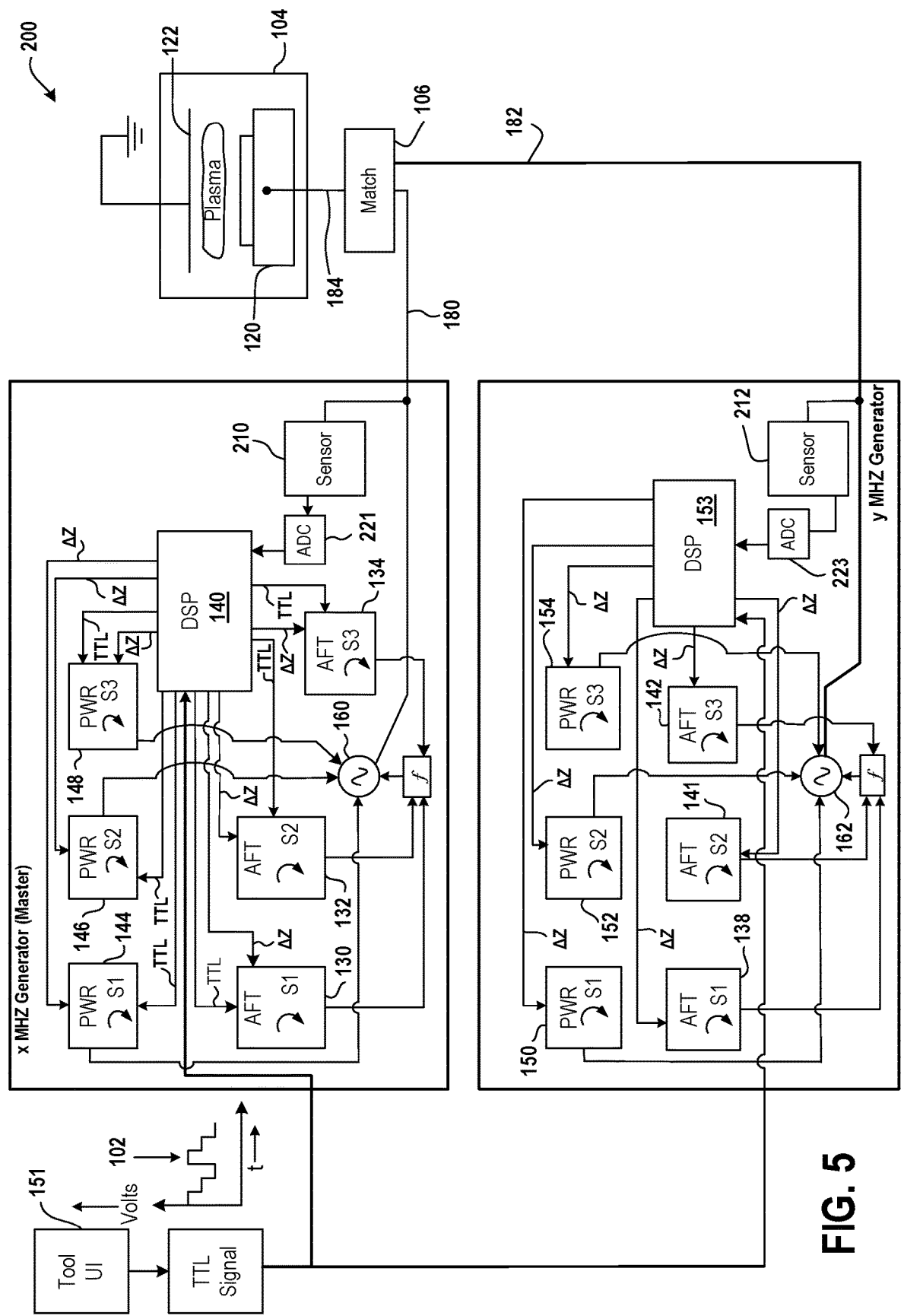
FIG. 5 is a diagram of a system for controlling a frequency and/or power of an RF signal that is generated by a y MHz RF generator based on a state of the pulsed signal and a change in impedance of plasma, in accordance with an embodiment described in the present disclosure.

FIG. 5 is a diagram of an embodiment of a system 200 for controlling, during production, a frequency and/or power of an RF signal that is generated by the y MHz RF generator based on a state of the pulsed signal 102 and a change in impedance of the plasma within the plasma chamber 104. The DSP 153 of the y MHz RF generator receives the pulsed signal 102 from the Tool UI 151.

When the pulsed signal 102 transitions from the state S3 to the state S1 and when the x MHz RF generator supplies forward power having the power level Pp1 and having the frequency level Fp1 to the plasma chamber 104, impedance of plasma within the plasma chamber 104 changes. When the impedance of plasma within the plasma chamber 104 changes as a result of transition of the pulsed signal 102 from the state S3 to the state S1, the sensor 212 measures the complex voltage and complex current being transferred via the RF cable 182. The sensor 212 provides the measurement of the complex voltage and complex current to the ADC converter 222, which converts the measurements from an analog format to a digital format. The digital values of the measurement of the complex voltage and complex current are provided to the DSP 153.

It should further be noted that in one embodiment, the DSP 153 lacks reception of the pulsed signal 102. Rather, in this embodiment, the DSP 153 receives another digital pulsed signal that may not be synchronous with the pulsed signal 102. In one embodiment, the other digital pulsed signal received by the DSP 153 is synchronous with the pulsed signal 102.

During the state S1 of the pulsed signal 102, e g, immediately after the state transition from the state S3 to the state S1 of the pulsed signal 102, etc., the DSP 153 calculates a first parametric value, e.g., a square root of a ratio of the digital reflected power signal and the digital forward power signal, a gamma value, a voltage standing wave ratio (VSWR), a change in impedance, etc., from the complex voltage and current measured during the state S1.

The DSP 153 determines whether the first parametric value is greater than or equal to a first threshold. When the DSP 153 determines that the first parametric value is greater than or equal to the first threshold, the DSP 153 indicates the same to the AFT 138 and to the power controller 150. The AFT 138 determines the frequency level Fs1 corresponding to the first parametric value that is at least equal to the first threshold and provides the frequency level Fs1 to the power supply 162. Moreover, the power controller 150 determines the power level Ps1 corresponding to the first parametric value that is at least equal to the first threshold and provides the power level Ps1 to the power supply 162. For example, the AFT 138 stores within a memory device, a table that maps the first parametric value, whose value is at least equal to the first threshold, with the frequency level Fs1 and the power controller 150 stores within a memory device a mapping between the power level Ps1 and the first parametric value, whose value is at least equal to the first threshold.

On the other hand, when the DSP 153 determines that the first parametric value is less than the first threshold, the DSP 153 indicates the same to the AFT 142 and to the power controller 154. The AFT 142 determines the frequency level Fs3 corresponding to the first parametric value being less the first threshold and provides the frequency level Fs3 to the power supply 162. Moreover, the power controller 154 determines the power level Ps3 corresponding to the first parametric value being less than the first threshold and provides the power level Ps3 to the power supply 162. For example, the AFT 142 stores within a memory device, a table that maps the first parametric value, whose value is less than the first threshold, with the frequency level Fs3 and the power controller 154 stores within a memory device a mapping between the power level Ps3 and the first parametric value, whose value is less than the first threshold.

Upon receiving a frequency level, e.g., a frequency level Fs1, Fs3, etc., and a power level, e.g., Ps1, Ps3, etc., the power supply 162 generates an RF signal having the frequency level and the power level and supplies the RF signal via the RF cable 182, the impedance matching circuit 106, and the RF transmission line 184 to the plasma chamber 104. For example, an amplifier of the power supply 162 supplies forward power having a power level that is proportional, e.g., same as, multiple of, etc. to the power level Ps1 and having the frequency level Fs1 via the RF cable 182, the impedance matching circuit 106, and the RF transmission line 184 to the plasma chamber 104.

When the pulsed signal 102 transitions from the state S1 to the state S2 and when the x MHz RF generator supplies forward power having the power level Pp2 and having the frequency level Fp2 to the plasma chamber 104, impedance of plasma within the plasma chamber 104 changes. When the impedance of plasma within the plasma chamber 104 changes as a result of transition of the pulsed signal 102 from the state S1 to the state S2, the sensor 212 measures the complex voltage and complex current being transferred via the RF cable 182. The sensor 212 provides the measurement of the complex voltage and complex current to the ADC converter 222, which converts the measurements from an analog format to a digital format. The digital values of the measurement of the complex voltage and complex current are provided to the DSP 153.

Moreover, during the state S2 of the pulsed signal 102, e g, immediately after the state transition from the state S1 to the state S2 of the pulsed signal 102, etc., the DSP 153 calculates a second parametric value, e.g., a square root of a ratio of the digital reflected power signal and the digital forward power signal, a gamma value, a voltage standing wave ratio (VSWR), a change in impedance, etc., from the complex voltage and current measured during the state S2.

The DSP 153 determines whether the second parametric value is greater than a second threshold. When the DSP 153 determines that the second parametric value is greater than or equal to the second threshold, the DSP 153 indicates the same to the AFT 141 and to the power controller 152. The AFT 141 determines the frequency level Fs2 corresponding to the second parametric value that is at least equal to the second threshold and provides the frequency level Fs2 to the power supply 162. Moreover, the power controller 152 determines the power level Ps2 corresponding to the second parametric value that is at least equal to the second threshold and provides the power level Ps2 to the power supply 162. For example, the AFT 141 stores within a memory device, a table that maps the second parametric value, whose value is at least equal to the second threshold, with the frequency level Fs2 and the power controller 152 stores within a memory device a mapping between the power level Ps2 and the second parametric value, whose value is at least equal to the second threshold.

On the other hand, when the DSP 153 determines that the second parametric value is less than the second threshold, the DSP 153 indicates the same to the AFT 138 and to the power controller 150. The AFT 138 determines the frequency level Fs1 corresponding to the second parametric value being less the second threshold and provides the frequency level Fs1 to the power supply 162. Moreover, the power controller 150 determines the power level Ps1 corresponding to the second parametric value being less than the second threshold and provides the power level Ps1 to the power supply 162. For example, the AFT 138 stores within a memory device, a table that maps the second parametric value, whose value is less than the second threshold, with the frequency level Fs1 and the power controller 150 stores within a memory device a mapping between the power level Ps1 and the second parametric value, whose value is less than the second threshold.

When the pulsed signal 102 transitions from the state S2 to the state S3 and when the x MHz RF generator supplies forward power having the power level Pp3 and having the frequency level Fp3 to the plasma chamber 104, impedance of plasma within the plasma chamber 104 changes. When the impedance of plasma within the plasma chamber 104 changes as a result of transition of the pulsed signal 102 from the state S2 to the state S3, the sensor 212 measures the complex voltage and complex current being transferred via the RF cable 182. The sensor 212 provides the measurement of the complex voltage and complex current to the ADC converter 222, which converts the measurements from an analog format to a digital format. The digital values of the measurement of the complex voltage and complex current are provided to the DSP 153.

Furthermore, during the state S3 of the pulsed signal 102, e.g., immediately after the state transition from the state S2 to the state S3 of the pulsed signal 102, etc., the DSP 153 calculates a third parametric value, e.g., a square root of a ratio of the digital reflected power signal and the digital forward power signal, a gamma value, a voltage standing wave ratio (VSWR), a change in impedance, etc., from the complex voltage and current measured during the state S3.

The DSP 153 determines whether the third parametric value is greater than a third threshold. When the DSP 153 determines that the third parametric value is greater than or equal to the third threshold, the DSP 153 indicates the same to the AFT 142 and to the power controller 154. The AFT 142 determines the frequency level Fs3 corresponding to the third parametric value being at least equal to the third threshold and provides the frequency level Fs3 to the power supply 162. Moreover, the power controller 154 determines the power level Ps3 corresponding to the third parametric value being at least equal to the third threshold and provides the power level Ps3 to the power supply 162. For example, the AFT 142 stores within a memory device, a table that maps the third parametric value, whose value is at least equal to the third threshold, with the frequency level Fs3 and the power controller 154 stores within a memory device a mapping between the power level Ps3 and the third parametric value, whose value is at least equal to the third threshold.

On the other hand, when the DSP 153 determines that the third parametric value is less than the third threshold, the DSP 153 indicates the same to the AFT 141 and to the power controller 152. The AFT 141 determines the frequency level Fs2 corresponding to the third parametric value being less the third threshold and provides the frequency level Fs2 to the power supply 162. Moreover, the power controller 152 determines the power level Ps2 corresponding to the third parametric value being less than the third threshold and provides the power level Ps2 to the power supply 162. For example, the AFT 141 stores within a memory device, a table that maps the third parametric value, whose value is less than the third threshold, with the frequency level Fs2 and the power controller 152 stores within a memory device a mapping between the power level Ps2 and the third parametric value, whose value is less than the third threshold.

The use of a parametric value to change RF power provided by the power supply 162 results in plasma stability. Also, the plasma stability is based on real-time measurement of complex voltage and current. This real-time measurement provides accuracy in stabilizing the plasma.

In the embodiments in which the z MHz RF generator is used in addition to using the x and y MHz RF generators, the z MHz RF generator is coupled to the Tool UI 151, and the pulsed signal 102 is sent from the Tool UI 151 to the z MHz RF generator. The z MHz RF generator functions in a manner similar to the y MHz RF generator. For example, during a state of the pulsed signal 102, it is determined whether a parametric value exceeds a threshold. Based on the determination of the parametric value, a first level or a second level of power and a first level or a second level of frequency is provided to a power supply of the z MHz RF generator.

In an embodiment, the first threshold, the second threshold, and the third threshold are generated during a training routine, e.g., a learning process. During the training routine, when the x MHz RF generator changes its RF power signal from a first power level to a second power level, there is an impedance mismatch between one or more portions, e.g., plasma, etc., within the plasma chamber 104 and the z MHz RF generator. The x MHz RF generator changes a level of its RF power signal from the first power level to the second power level when a state of the pulsed signal 102 changes from S3 to S1. In this case, the y MHz RF generator has its frequency and power tuned when the x MHz RF generator starts supplying power at the power level Pp1. To reduce the impedance mismatch, the y MHz RF generator starts tuning, e.g., converging, to a power level and to a frequency level. The convergence may be determined by the DSP 153 based on a standard deviation or another technique. To allow the y MHZ RF generator more time to converge to the power level and to the frequency level, the x MHZ RF generator is kept at the second power level for an extended period of time than a usual period of time. The usual period of time is an amount of time in which the impedance mismatch is not reduced, e.g., removed.

When the y MHz RF generator converges to the power level and the frequency level, the converged power level is stored as the power level Ps1 within the power controller 150 and the converged frequency level is stored as the frequency level Fs1 within the AFT 138. The first threshold is generated from the power level Ps1 during the training routine and the first threshold corresponds to the frequency level Fs1. For example, the sensor 212 measures complex voltage and complex current during the training routine. The sensor 212 measures the complex voltage and complex current during the training routine when the frequency of the y MHz RF generator is Fs1. The DSP 153 receives the complex voltage and complex current and generates the first threshold from the complex voltage and complex current measured during the training routine.

Similarly, during the training routine, the second and third thresholds are determined by the DSP 153.

Figure 6:
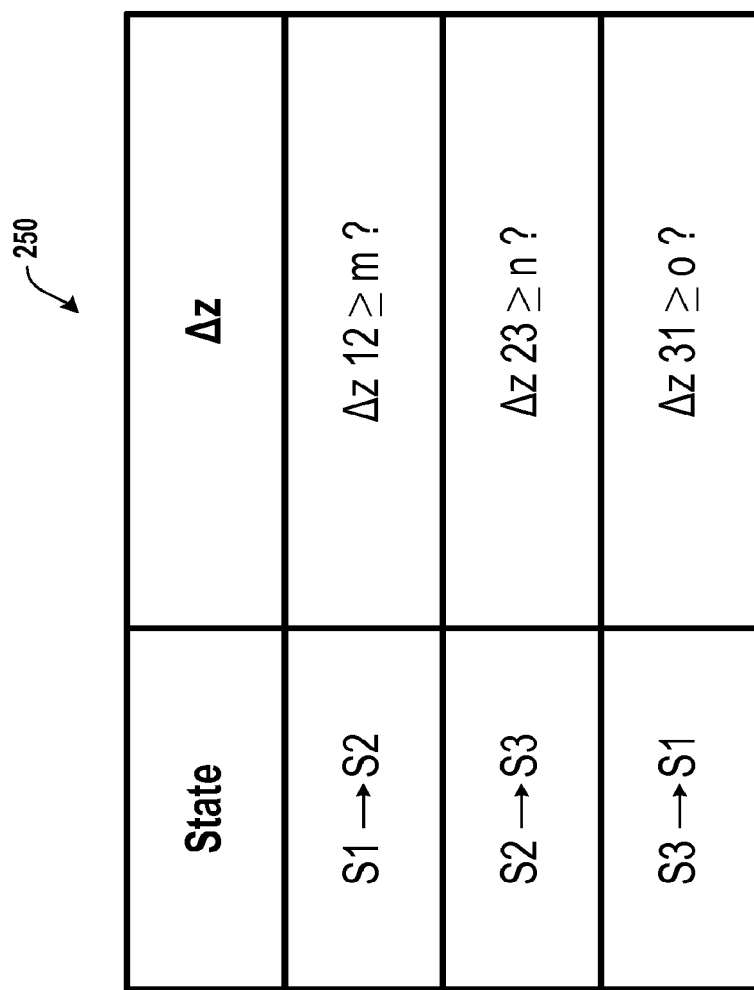
FIG. 6 is a diagram of a table illustrating a comparison of a change in impedance with a threshold to determine a power level or a frequency level of an RF signal supplied by an RF generator, in accordance with an embodiment described in the present disclosure.

FIG. 6 is a diagram of an embodiment of a table 250 illustrating a comparison of a change in impedance with a threshold to determine a power level or a frequency level of an RF signal supplied by an RF generator. When the state of the pulsed signal changes from the state S1 to the state S2, it is determined whether a change in impedance $\Delta z12$ of plasma is greater than the second threshold, indicated as 'm'. Upon determining that the change in the impedance $\Delta z12$ is at least equal to the second threshold m, the power level Ps2 or the frequency level Fs2 are provided to the power supply 162 of the y MHz RF generator. On the other hand, upon determining that the change in the impedance $\Delta z12$ is less than the second threshold m, the power level Ps1 or the frequency level Fs1 are provided to the power supply 162 of the y MHz RF generator.

Similarly, when the state of the pulsed signal changes from the state S2 to the state S3, it is determined whether a change in impedance $\Delta z23$ of plasma is greater than the third threshold, indicated as 'n'. Upon determining that the change in the impedance $\Delta z23$ is greater than the third threshold n, the power level Ps3 or the frequency level Fs3 are provided to the power supply 162 of the y MHz RF generator. On the other hand, upon determining that the change in the impedance $\Delta z23$ is less than the third threshold n, the power level Ps2 or the frequency level Fs2 are provided to the power supply 162 of the y MHz RF generator.

Moreover, when the state of the pulsed signal changes from the state S3 to the state S1, it is determined whether a change in impedance $\Delta z31$ of plasma is greater than the first threshold, indicated as 'o'. Upon determining that the change in the impedance Δz31 is greater than the first threshold o, the power level Ps1 or the frequency level Fs1 are provided to the power supply 162 of the y MHz RF generator. On the other hand, upon determining that the change in the impedance Δz31 is less than the first threshold o, the power level Ps3 or the frequency level Fs3 are provided to the power supply 162 of the y MHz RF generator.

In some embodiments, instead of a change in impedance, another parametric value, e.g., gamma, VSWR, etc., may be used to determine a power level and/or a frequency level to provide to the power supply 162.

Figure 7:
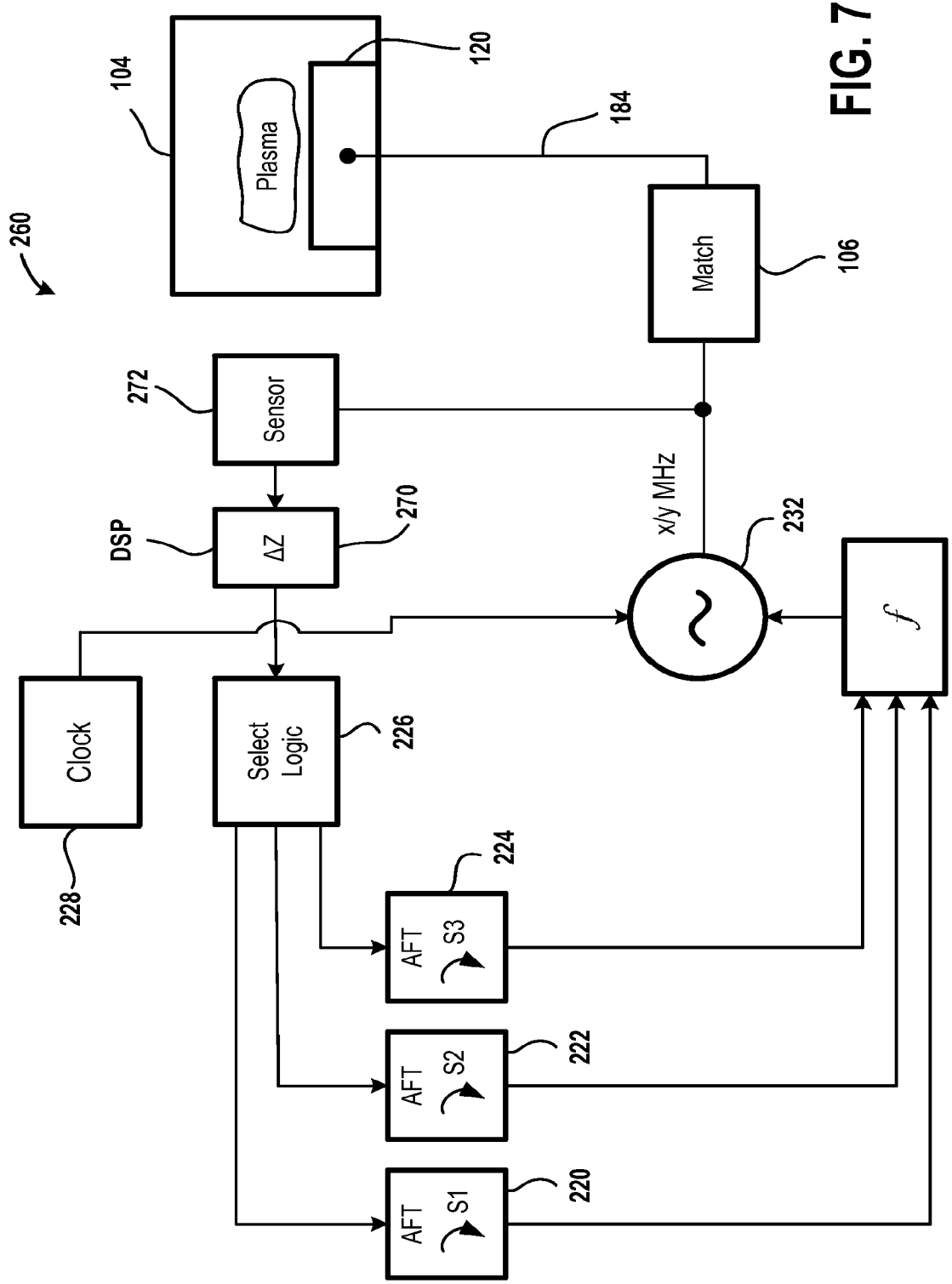
FIG. 7 is a diagram of a system for selecting an AFT based on a state of the pulsed signal and based on whether a parametric value exceeds a threshold, in accordance with an embodiment described in the present disclosure.

FIG. 7 is a diagram of an embodiment of a system 260 for selecting, during production, AFT 220, 222, or 224 based on a state of the pulsed signal 102 and based on whether a parametric value exceeds a threshold. When the pulsed signal 102 is in the state S1 and a parametric value measured during the state S1 is at least equal to the first threshold, the select logic 226 selects the AFT 220. On the other hand, when the pulsed signal 102 is in the state S1 and a parametric value measured during the state S1 is less than the first threshold, the select logic 226 selects the AFT 224.

When the select logic 226 includes the multiplexer, a signal indicating that a parametric value during a state of the pulsed signal 102 is at least equal to or less than the threshold is received at select inputs of the multiplexer from a DSP 270.

The DSP 270 is an example of the DSP 153 (FIG. 1). Based on a complex current and a complex voltage received from a sensor 272 during the state S1, the DSP 270 determines the first parametric value. The DSP 270 further determines that the first parametric value is at least equal to the first threshold and provides a signal indicating the determination to the select logic 226. The select logic 226 selects the AFT 220 upon receiving the signal indicating the determination that the first parametric value is at least equal to the first threshold. On the other hand, the DSP 270 determines that the first parametric value determined during the state S1 of the pulsed signal 102 is less than the first threshold and provides a signal indicating the determination to the select logic 226. The select logic 226 selects the AFT 224 upon receiving the signal indicating the determination that the first parametric value is less than the first threshold. The sensor 272 is an example of the sensor 212 (FIG. 1) of the y MHz RF generator.

Moreover, based on a complex current and a complex voltage received from a sensor 272 during the state S2, the DSP 270 determines the second parametric value. The DSP 270 further determines that the second parametric value is at least equal to the second threshold and provides a signal indicating the determination to the select logic 226. The select logic 226 selects the AFT 222 upon receiving the signal indicating the determination that the second parametric value is at least equal to the second threshold. On the other hand, the DSP 270 determines that the second parametric value determined during the state S2 of the pulsed signal 102 is less than the second threshold and provides a signal indicating the determination to the select logic 226. The select logic 226 selects the AFT 220 upon receiving the signal indicating the determination that the second parametric value is less than the second threshold.

Furthermore, based on a complex current and a complex voltage received from a sensor 272 during the state S3, the DSP 270 determines the third parametric value. The DSP 270 further determines that the third parametric value is at least equal to the third threshold and provides a signal indicating the determination to the select logic 226. The select logic 226 selects the AFT 224 upon receiving the signal indicating the determination that the third parametric value is at least equal to the third threshold. On the other hand, the DSP 270 determines that the third parametric value determined during the state S3 of the pulsed signal 102 is less than the third threshold and provides a signal indicating the determination to the select logic 226. The select logic 226 selects the AFT 222 upon receiving the signal indicating the determination that the third parametric value is less than the third threshold.

In some embodiments, the select logic 226 selects between power controllers instead of the AFTs 220, 222, and 224. For example, the select logic 226 is coupled to the power controllers 150, 152, and 154 of the y MHz RF generator (FIG. 1). In this example, the select logic 226 selects the power controller 150 upon receiving the signal indicating the determination that the first parametric value is at least equal to the first threshold and selects the power controller 154 upon receiving the signal indicating the determination that the first parametric value is less than the first threshold. As another example, the select logic 226 selects the power controller 152 upon receiving the signal indicating the determination that the second parametric value is at least equal to the second threshold and selects the power controller 150 upon receiving the signal indicating the determination that the second parametric value is less than the second threshold. As yet another example, the select logic 226 selects the power controller 154 upon receiving the signal indicating the determination that the third parametric value is at least equal to the third threshold and selects the power controller 152 upon receiving the signal indicating the determination that the third parametric value is less than the third threshold.

In a number of embodiments, the select logic 226 is implemented within the z MHz RF generator and functions in a similar manner as that described herein. For example, the select logic 226 selects between AFTs of the z MHz RF generator or between power controllers of the z MHz RF generator based on a state of the pulsed signal 102 and based on whether a parametric value exceeds a threshold.

Figure 8A:
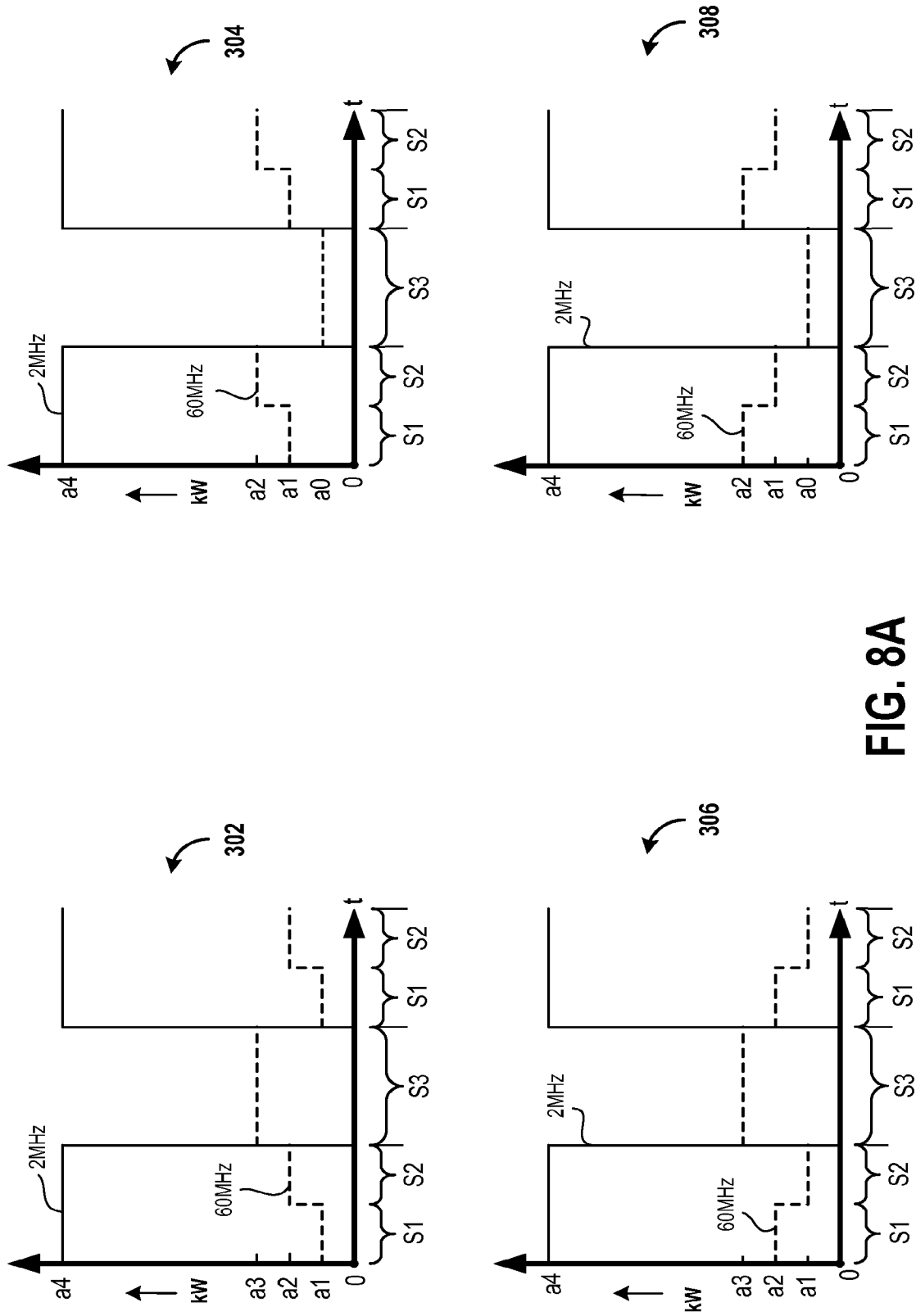
FIG. 8A is a diagram of graphs to illustrate signals generated by two RF generators, where one of the signals has a different power value for each state and another one of the signals has a power value of zero during a state, in accordance with an embodiment described in the present disclosure.

FIG. 8A is a diagram of embodiments of graphs 302, 304, 306, and 308. Each graph 302, 304, 306, and 308 plots power values in kilowatts (kW) as a function of time t. As indicated in graph 302, a 2 MHz power signal, which is a power signal supplied by the 2 MHz power supply has a power value of a4 during the states S1 and S2 and has a power value of 0 during the state S3. Also, a 60 MHz power signal, which is a power signal supplied by the 60 MHz power supply has a power value of a1 during the state S1, has a power value of a2 during the state S2, and has a power value of a3 during the state S3. The power value of a4 is greater than the power value of a3, which is greater than the power value of a2. The power value of a2 is greater than the power value of a1, which is greater than zero.

As indicated in the graph 304, the 60 MHz power signal has a power value a0 during state S3. The power value of a0 is less than the power value of a1. Moreover, as indicated in graph 306, the 60 MHz signal has the power value of a2 during the state S1, the power value of a1 during the state S2, and the power value of a3 during the state S3. As indicated in graph 308, the 60 MHz signal has the power value of a2 during the state S1, the power value of a1 during the state S2, and the power value of a0 during the state S3.

Figure 8B:
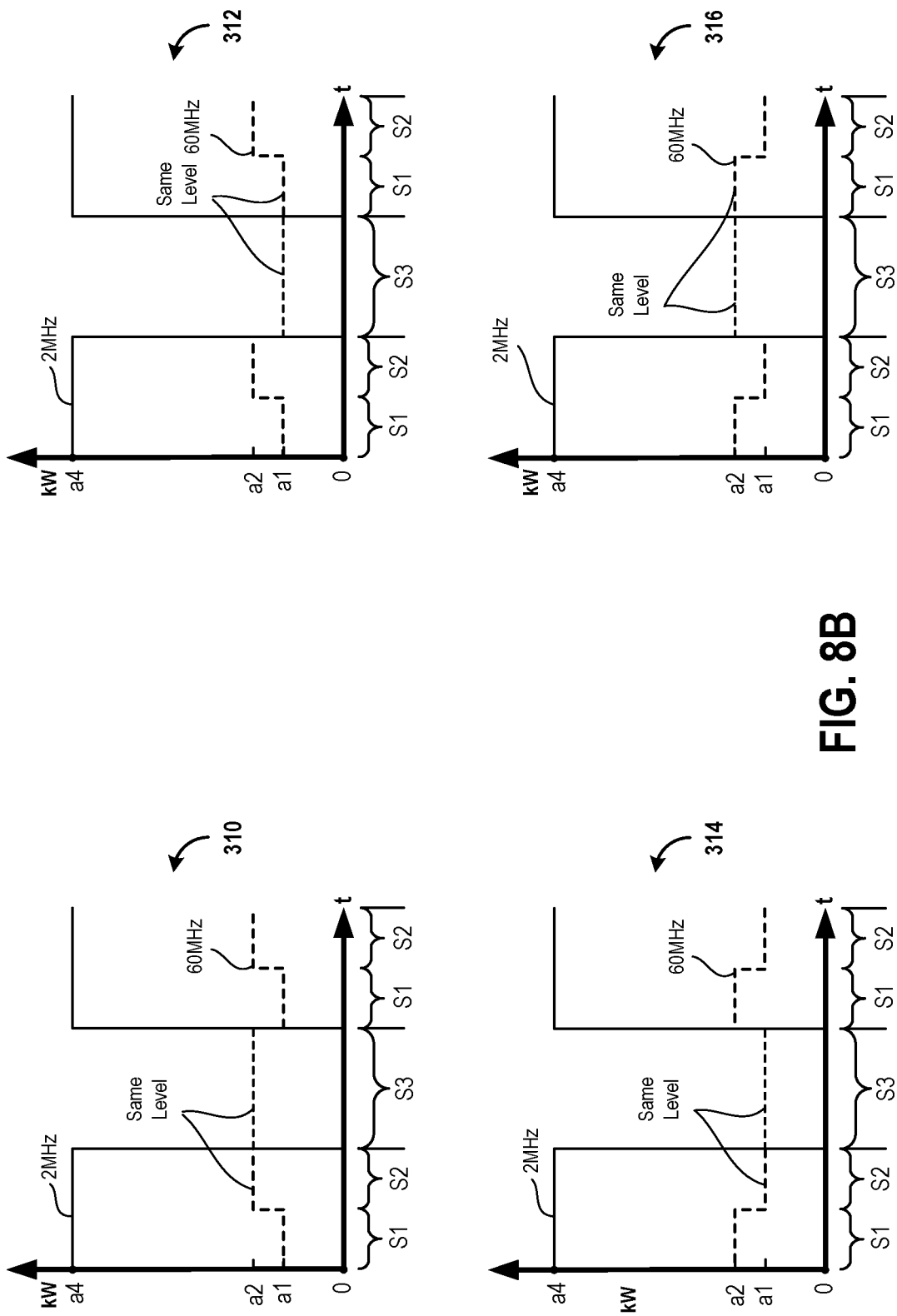
FIG. 8B is a diagram of graphs to illustrate signals generated by two RF generators, where one of the signals has a same power value for two states and another one of the signals has a power value of zero during a state, in accordance with an embodiment described in the present disclosure.

FIG. 8B is a diagram of embodiments of graphs 310, 312, 314, and 316. Each graph 310, 312, 314, and 316 plots power values in kW as a function of time t. As indicated in graph 310, a 60 MHz power signal has the power value of a1 during the state S1, has a power value of a2 during the state S2, and has the power value of a2 during the state S3.

As indicated in the graph 312, a 60 MHz power signal has the power value of a1 during the state S1, has the power value of a2 during the state S2, and has a power value of a1 during the state S3. Moreover, as indicated in graph 314, a 60 MHz signal has a power value of a2 during the state S1, the power value of a1 during the state S2, and the power value of a1 during the state S3. As indicated in graph 316, a 60 MHz signal has the power value of a2 during the state S1, the power value of a1 during the state S2, and the power value of a2 during the state S3.

Figure 9A:
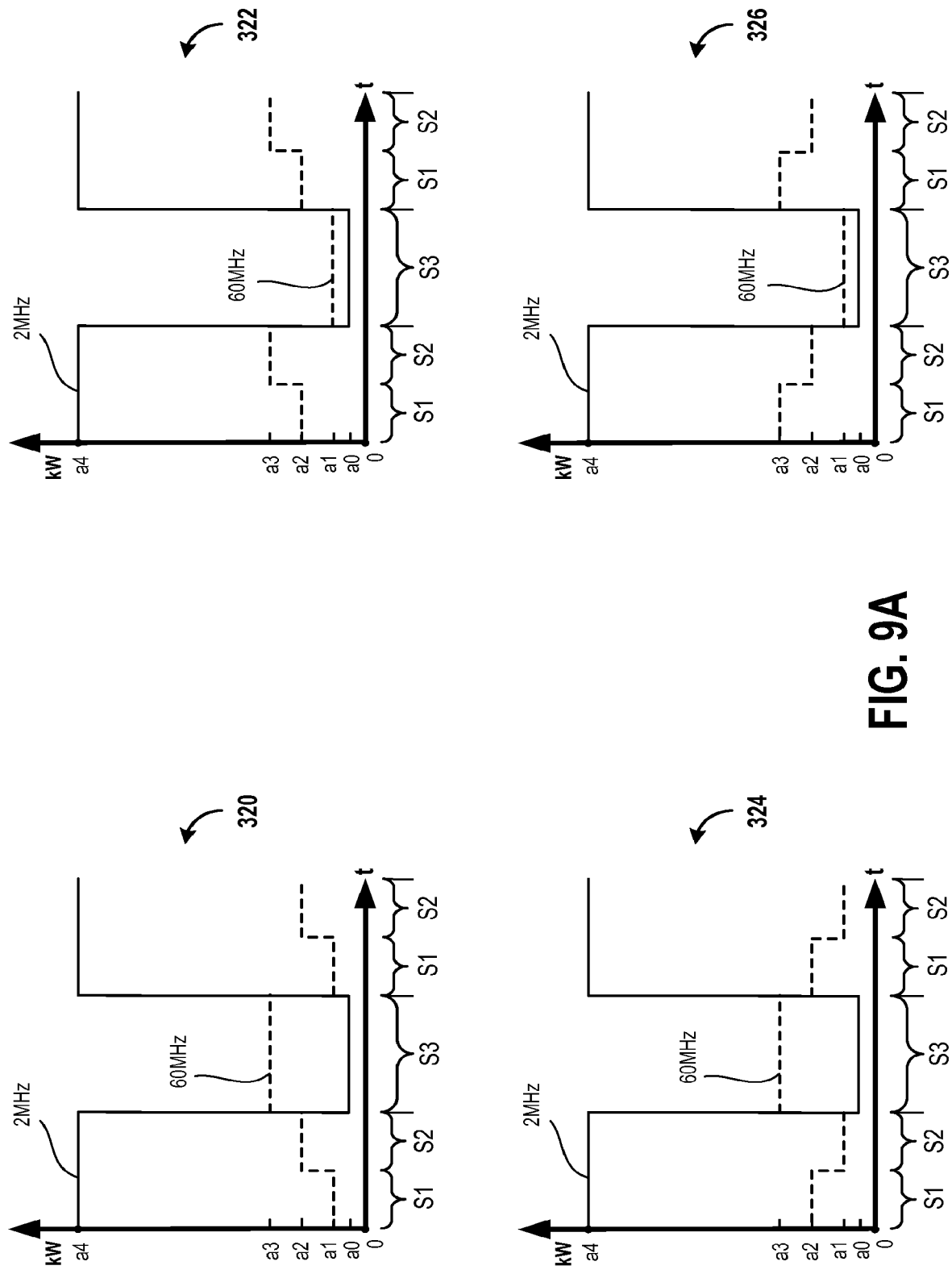
FIG. 9A is a diagram of graphs to illustrate signals generated by two RF generators, where one of the signals has a different power value for each state and another one of the signals has a non-zero power value during all states, in accordance with an embodiment described in the present disclosure.

FIG. 9A is a diagram of embodiments of graphs 320, 322, 324, and 326. Each graph 320, 322, 324, and 326 plots power values in kW as a function of time t. As indicated in graph 320, a 60 MHz power signal has the power value of a1 during the state S1, has the power value of a2 during the state S2, and has the power value of a3 during the state S3. Moreover, in graph 320, a 2 MHz power signal has the power value of a4 during the state S1, has the power value of a4 during the state S2, and has the power value of a0 during the state S3. The power value of a0 is less than the power value of a1 and is greater than zero.

Moreover, as indicated in graph 322, a 60 MHz power signal has the power value of a2 during the state S1, has the power value of a3 during the state S2, and has the power value of a1 during the state S3. Also, as indicated in graph 324, a 60 MHz power signal has the power value of a2 during the state S1, has the power value of a1 during the state S2, and has the power value of a3 during the state S3. Furthermore, as indicated in graph 326, a 60 MHz power signal has the power value of a3 during the state S1, has the power value of a2 during the state S2, and has the power value of a1 during the state S3.

Figure 9B:
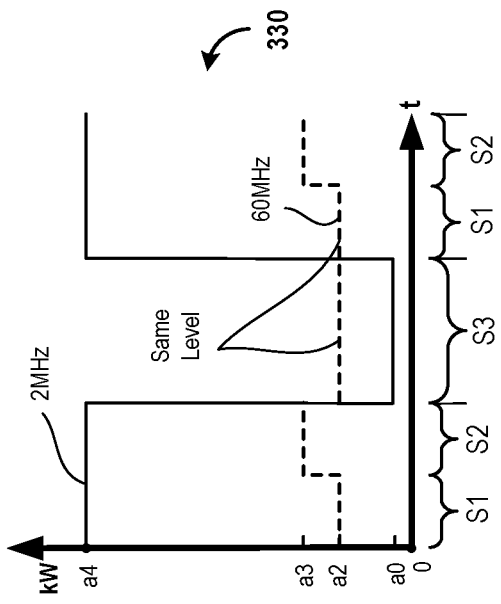
FIG. 9B is a diagram of graphs to illustrate signals generated by two RF generators, where one of the signals has a same power value for two states and another one of the signals has a non-zero power value during all states, in accordance with an embodiment described in the present disclosure.
Figure 9B:
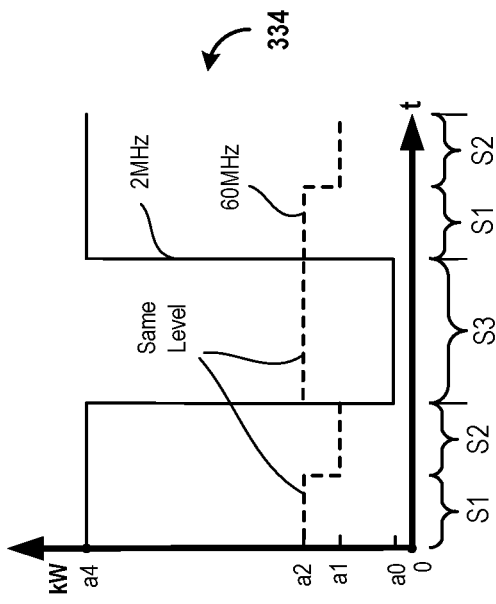
Figure 9B:
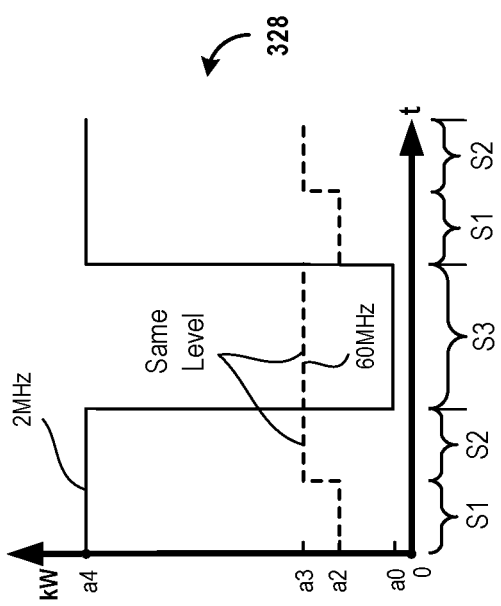
Figure 9B:
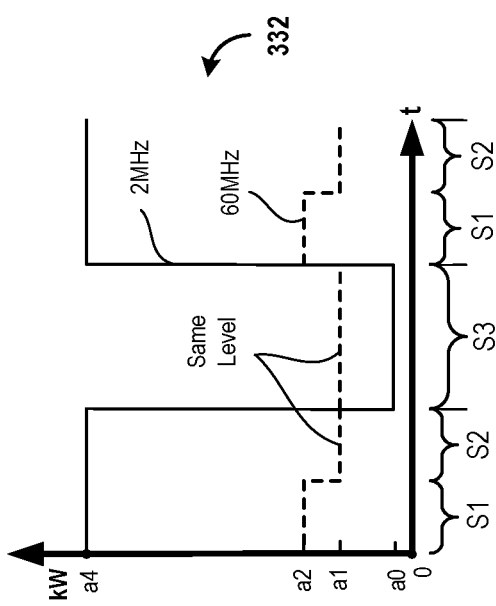

FIG. 9B is a diagram of embodiments of graphs 328, 330, 332, and 334. Each graph 328, 330, 332, and 334 plots power values in kW as a function of time t. As indicated in graph 328, a 60 MHz power signal has the power value of a2 during the state S1, has the power value of a3 during the state S2, and has the power value of a3 during the state S3. Moreover, in graph 330, a 60 MHz power signal has the power value of a2 during the state S1, has the power value of a3 during the state S2, and has the power value of a2 during the state S3. Furthermore, in graph 332, a 60 MHz power signal has the power value of a2 during the state S1, has the power value of a1 during the state S2, and has the power value of a1 during the state S3. Also, in graph 334, a 60 MHz power signal has the power value of a2 during the state S1, has the power value of a1 during the state S2, and has the power value of a2 during the state S3.

Figure 10A:
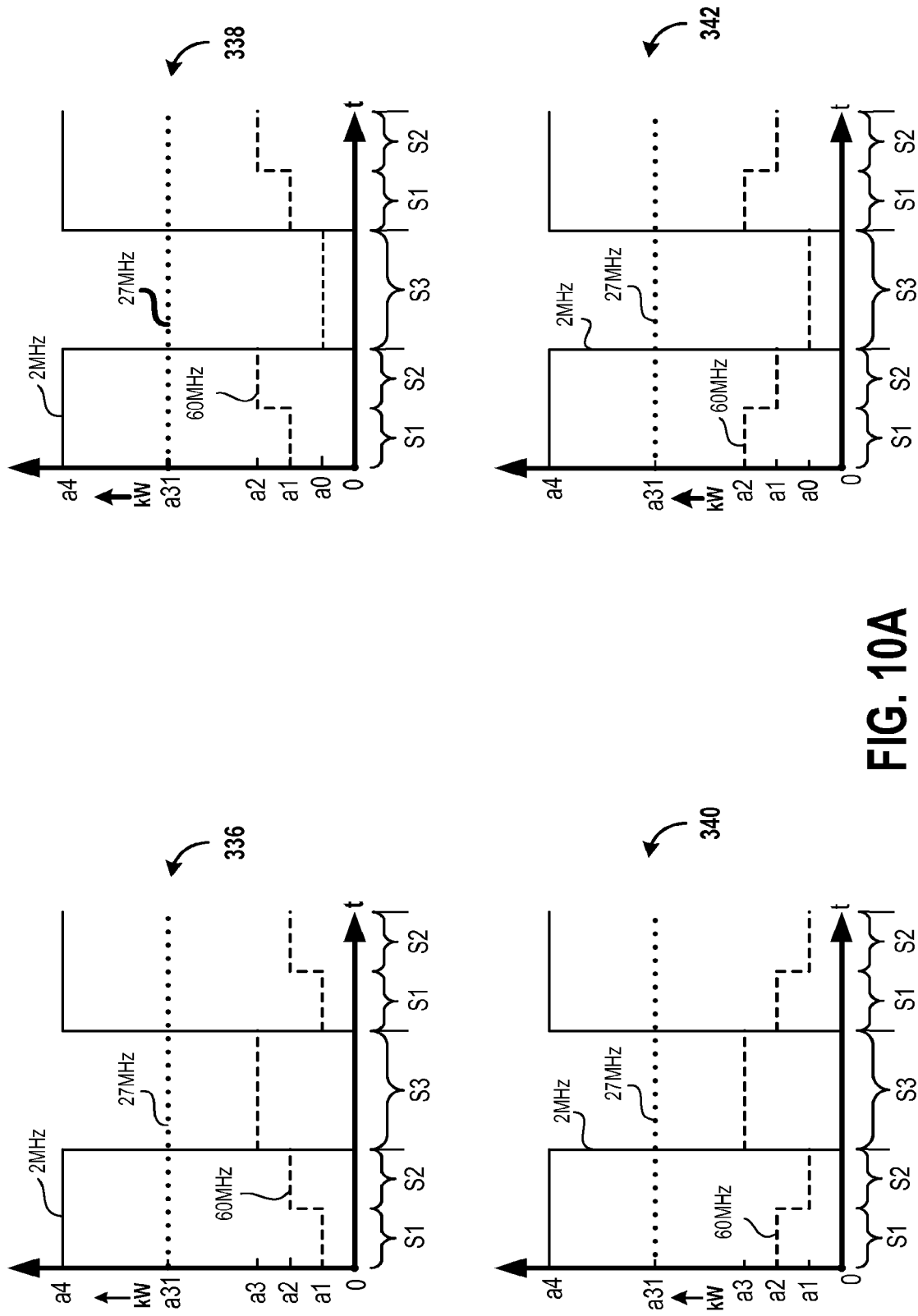
FIG. 10A is a diagram of graphs to illustrate signals generated by three RF generators, where one of the signals has a different power value for each state, another one of the signals has a power value of zero during a state, and yet another one of the signals has a constant power value during all states, in accordance with an embodiment described in the present disclosure.

FIG. 10A is a diagram of embodiments of graphs 336, 338, 340, and 342. Each graph 336, 338, 340, and 342 plots power values in kW as a function of time t. As indicated in graph 336, a 27 MHz power signal, which is a power signal supplied by the 27 MHz power supply has a power value of a31 during the states S1, S2, and S3. The power value of a31 is greater than the power value of a3 and less than the power value of a4. The remaining of graph 336 is similar to the graph 302 (FIG. 8A).

As indicated in each of graph 338, 340, and 342, a 27 MHz power signal has a power value of a31 during the states S1, S2, and S3. Moreover, the remaining of graph 338 is similar to the graph 304 (FIG. 8A), the remaining of graph 340 is similar to the graph 306 (FIG. 8A), and the remaining of graph 342 is similar to the graph 308 (FIG. 8A).

In some embodiments, the power value a31 is between zero and the power value of a4.

Figure 10B:
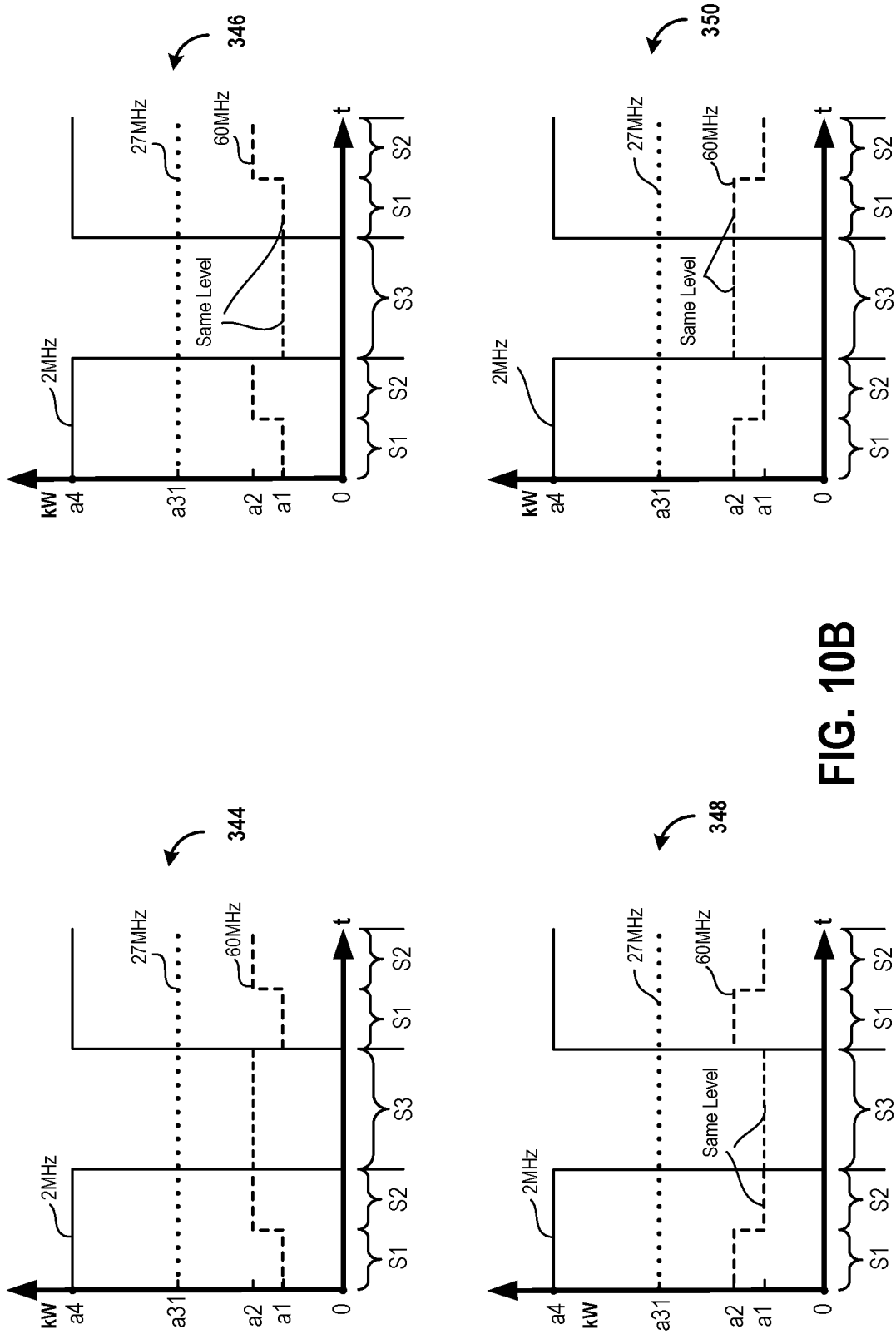
FIG. 10B is a diagram of graphs to illustrate signals generated by three RF generators, where one of the signals has a same power value for two states and another one of the signals has a power value of zero during a state, and yet another one of the signals has a constant power value during all states, in accordance with an embodiment described in the present disclosure.

FIG. 10B is a diagram of embodiments of graphs 344, 346, 348, and 350. Each graph 344, 346, 348, and 350 plots power values in kW as a function of time t. As indicated in graph 344, a 27 MHz power signal, which is a power signal supplied by the 27 MHz power supply has a power value of a31 during the states S1, S2, and S3. The remaining of graph 344 is similar to the graph 310 (FIG. 8B).

As indicated in each of graph 346, 348, and 350, a 27 MHz power signal has a power value of a31 during the states S1, S2, and S3. Moreover, the remaining of graph 346 is similar to the graph 312 (FIG. 8B), the remaining of graph 348 is similar to the graph 314 (FIG. 8B), and the remaining of graph 350 is similar to the graph 316 (FIG. 8B).

Figure 11A:
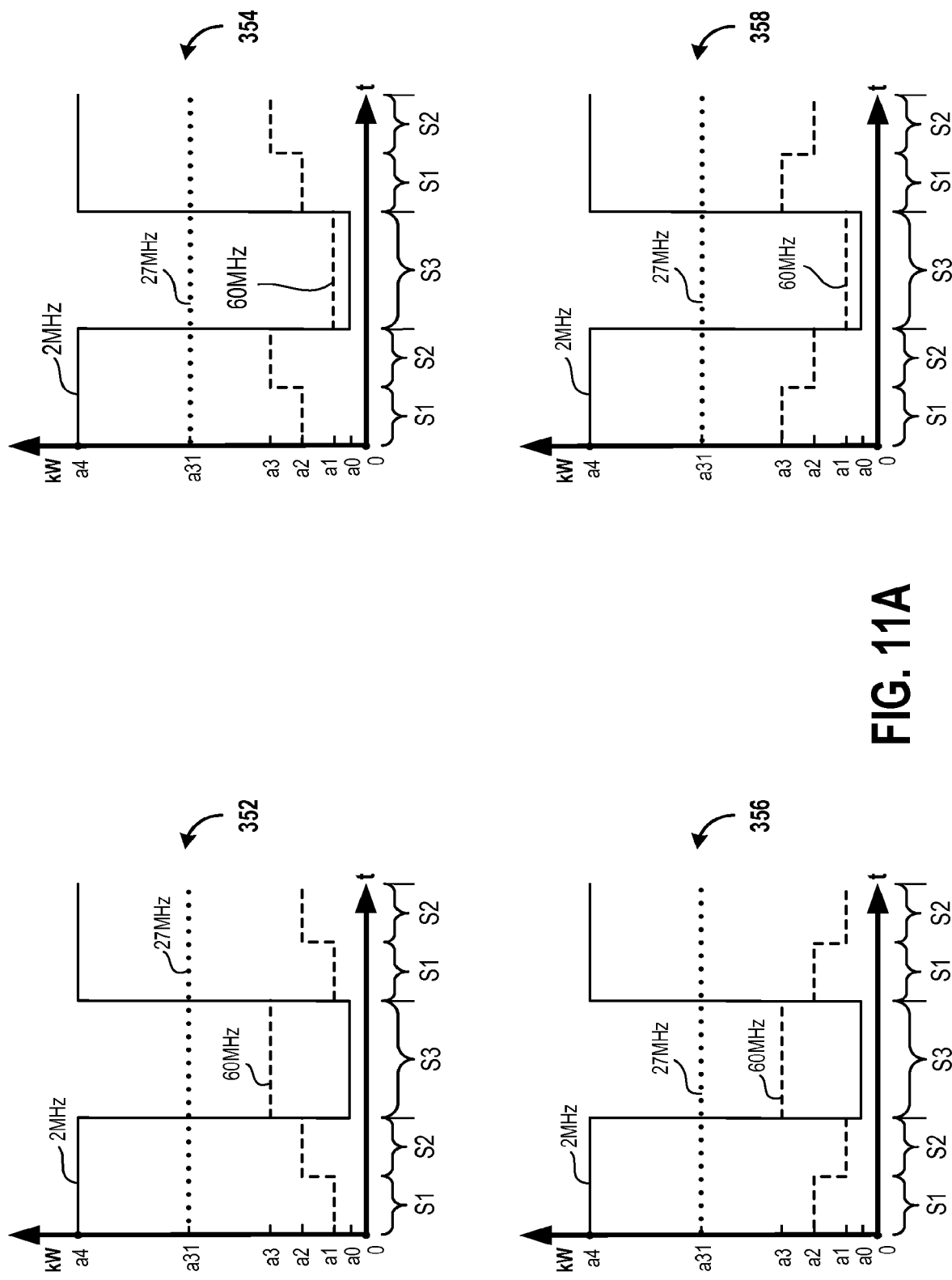
FIG. 11A is a diagram of graphs to illustrate signals generated by three RF generators, where one of the signals has a different power value for each state, another one of the signals has a non-zero power value during all states, and yet another one of the signals has a constant power value during all states, in accordance with an embodiment described in the present disclosure.

FIG. 11A is a diagram of embodiments of graphs 352, 354, 356, and 358. Each graph 352, 354, 356, and 358 plots power values in kW as a function of time t. As indicated in graph 352, a 27 MHz power signal, which is a power signal supplied by the 27 MHz power supply has a power value of a31 during the states S1, S2, and S3. The remaining of graph 352 is similar to the graph 320 (FIG. 9A).

As indicated in each of graph 354, 356, and 358, a 27 MHz power signal has a power value of a31 during the states S1, S2, and S3. Moreover, the remaining of graph 354 is similar to the graph 322 (FIG. 9A), the remaining of graph 356 is similar to the graph 324 (FIG. 9A), and the remaining of graph 358 is similar to the graph 326 (FIG. 9A).

Figure 11B:
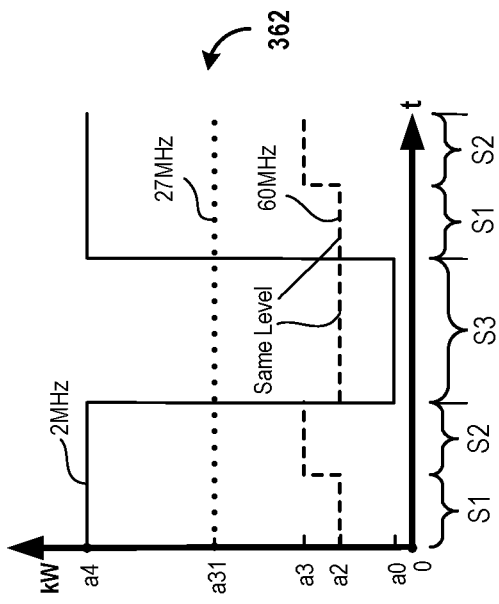
FIG. 11B is a diagram of graphs to illustrate signals generated by three RF generators, where one of the signals has a same power value for two states and another one of the signals has a non-zero power value during all states, and yet another one of the signals has a constant power value during all states, in accordance with an embodiment described in the present disclosure.
Figure 11B:
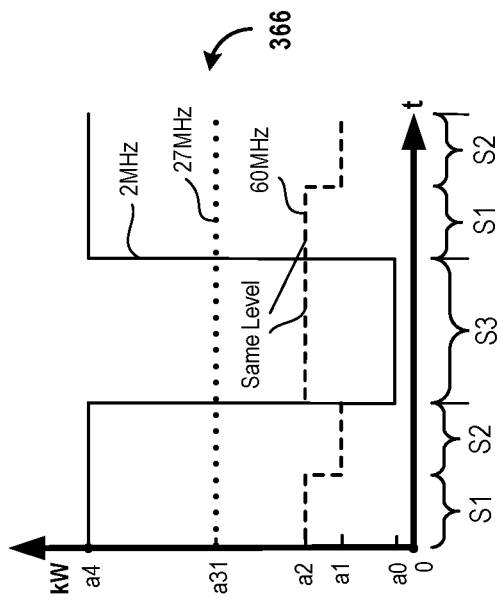
Figure 11B:
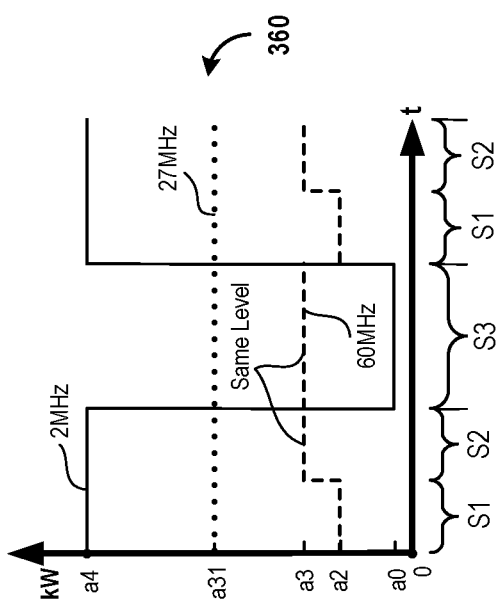
Figure 11B:
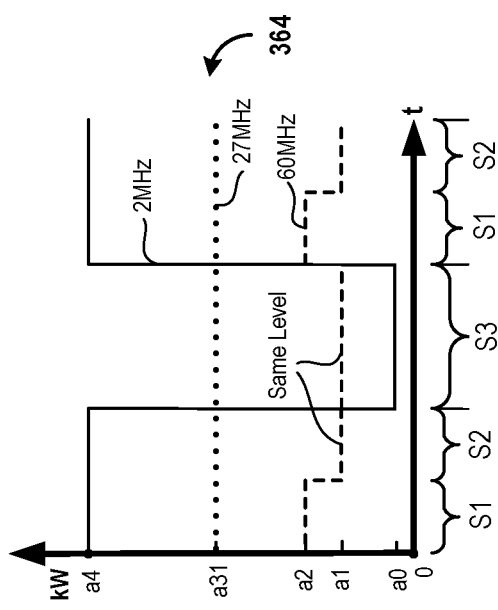

FIG. 11B is a diagram of embodiments of graphs 360, 362, 364, and 366. Each graph 360, 362, 364, and 366 plots power values in kW as a function of time t. As indicated in each graph 360, 362, 364, and 366, a 27 MHz power signal has a power value of a31 during the states S1, S2, and S3. The remaining of graph 360 is similar to the graph 328 (FIG. 9B). Moreover, the remaining of graph 362 is similar to the graph 330 (FIG. 9B), the remaining of graph 364 is similar to the graph 332 (FIG. 9B), and the remaining of graph 366 is similar to the graph 334 (FIG. 9B).

Figure 12A:
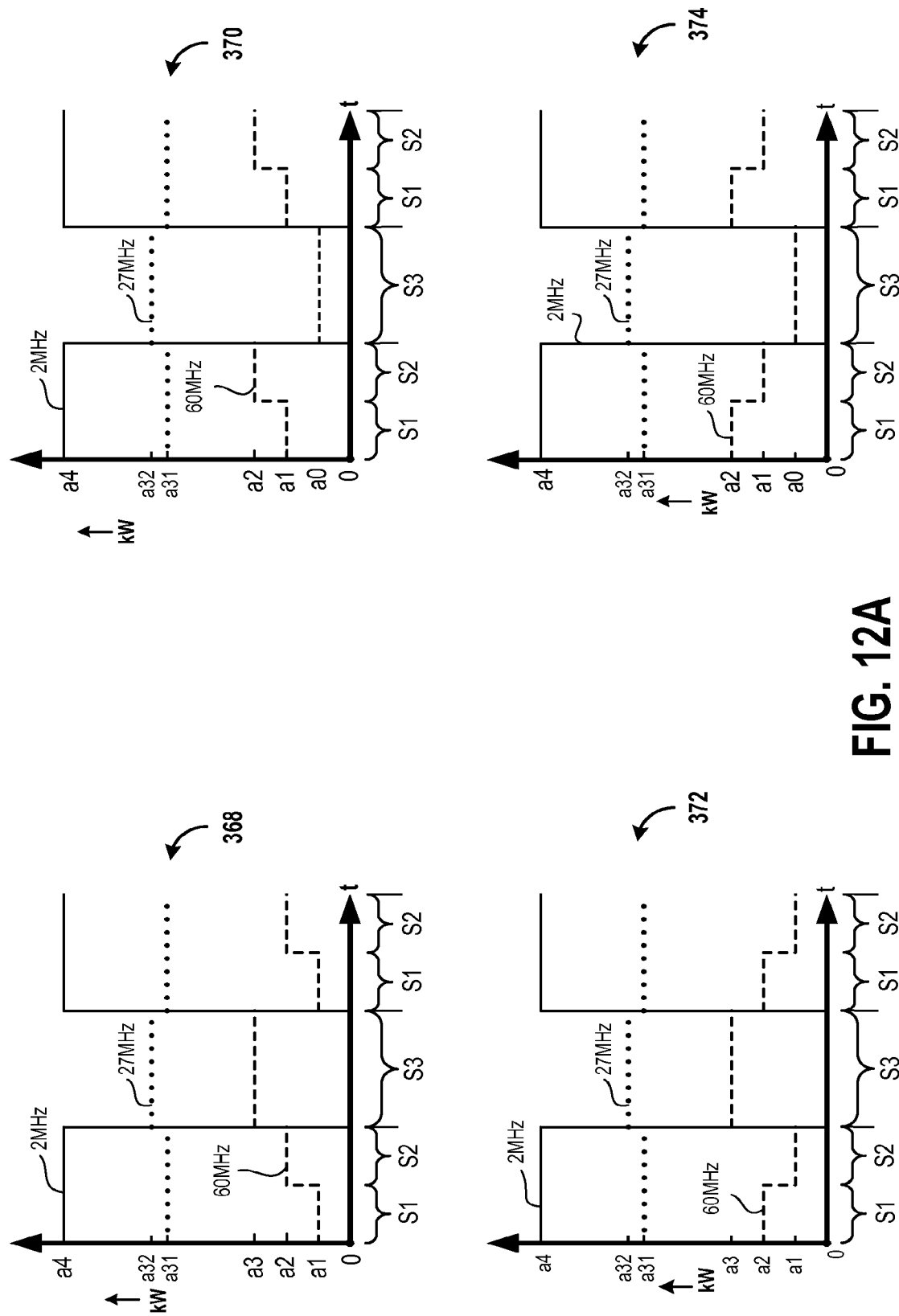
FIG. 12A is a diagram of graphs to illustrate signals generated by three RF generators, where one of the signals has a different power value for each state, another one of the signals has a power value of zero during a state, and yet another one of the signals has a same power value for two states, in accordance with an embodiment described in the present disclosure.

FIG. 12A is a diagram of embodiments of graphs 368, 370, 372, and 374. Each graph 368, 370, 372, and 374 plots power values in kW as a function of time t. As indicated in each graph 368, 370, 372, and 374, a 27 MHz power signal has a power value of a31 during the states S1 and S2, and has a power value of a32 during the state S3. The remaining of graph 368 is similar to the graph 302 (FIG. 8A). Moreover, the remaining of graph 370 is similar to the graph 304 (FIG. 8A), the remaining of graph 372 is similar to the graph 306 (FIG. 8A), and the remaining of graph 374 is similar to the graph 308 (FIG. 8A).

Figure 12B:
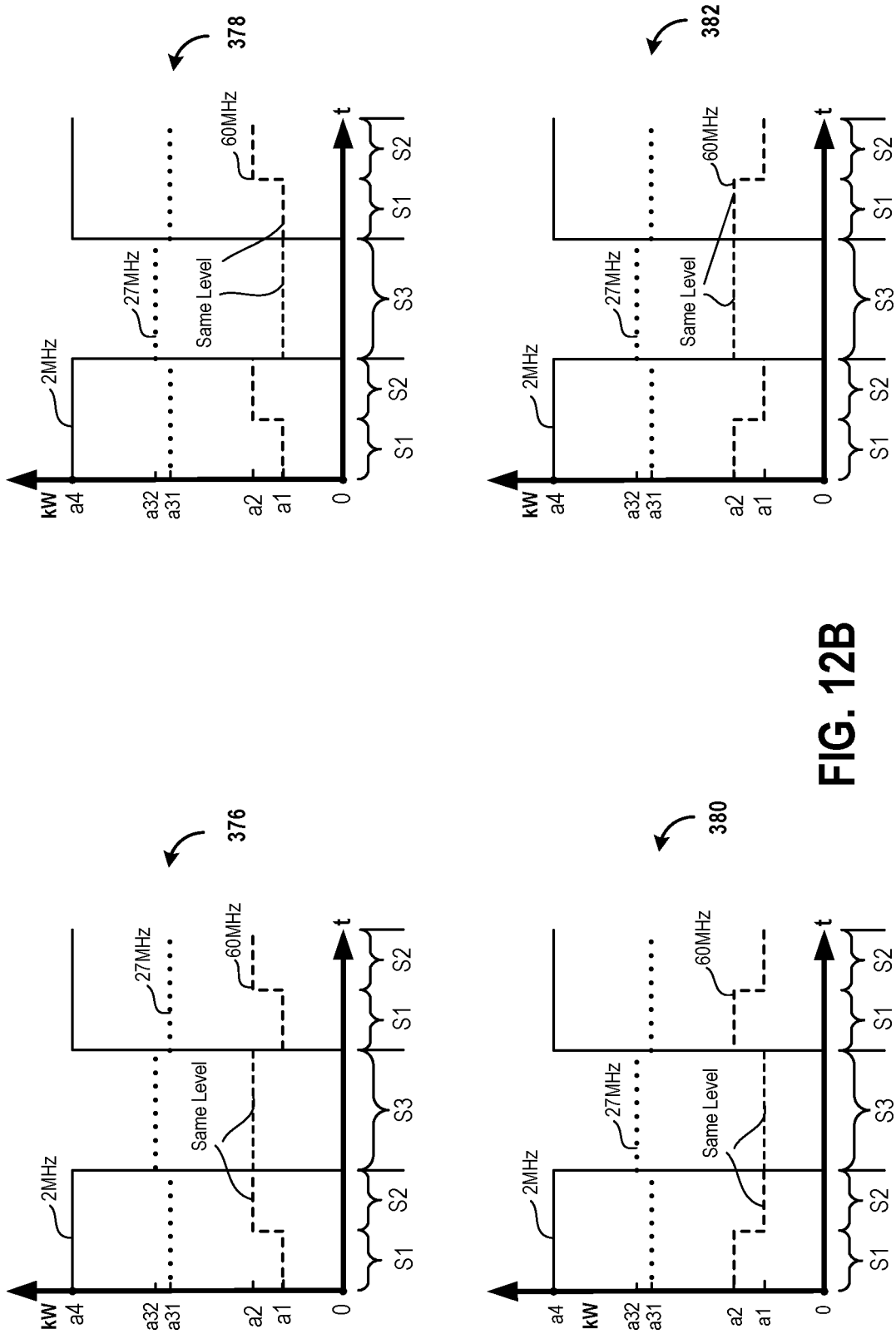
FIG. 12B is a diagram of graphs to illustrate signals generated by three RF generators, where one of the signals has the same power value for two states, another one of the signals has a power value of zero during a state, and yet another one of the signals has a same power value for two states, in accordance with an embodiment described in the present disclosure.

FIG. 12B is a diagram of embodiments of graphs 376, 378, 380, and 382. Each graph 376, 378, 380, and 382 plots power values in kW as a function of time t. As indicated in each graph 376, 378, 380, and 382, a 27 MHz power signal has a power value of a31 during the states S1 and S2, and has a power value of a32 during the state S3. The power value of a32 is greater than the power value a31. The remaining of graph 376 is similar to the graph 310 (FIG. 8B). Moreover, the remaining of graph 378 is similar to the graph 312 (FIG. 8B), the remaining of graph 380 is similar to the graph 314 (FIG. 8B), and the remaining of graph 382 is similar to the graph 316 (FIG. 8B).

Figure 13A:
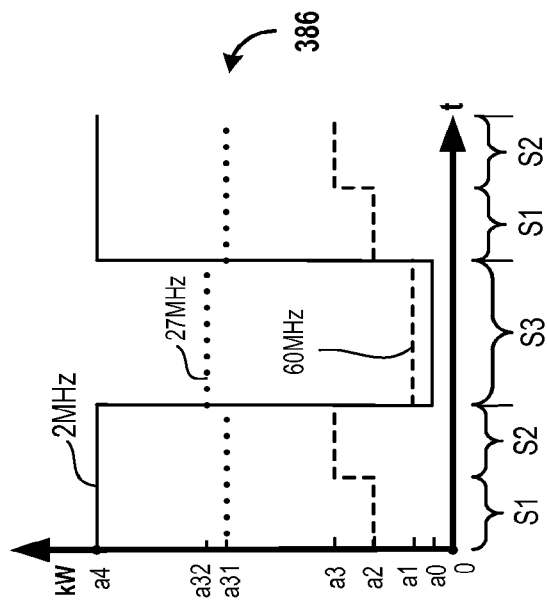
FIG. 13A is a diagram of graphs to illustrate signals generated by three RF generators, where one of the signals has a different power value for each state, another one of the signals has non-zero power values for all states, and yet another one of the signals has a same power value for two states, in accordance with an embodiment described in the present disclosure.
Figure 13A:
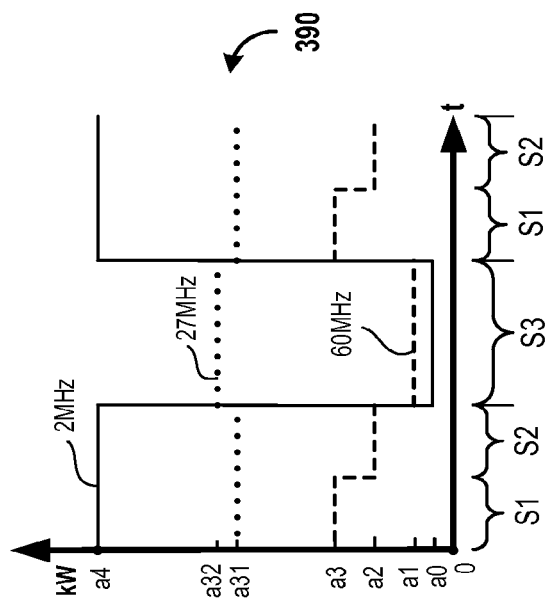
Figure 13A:
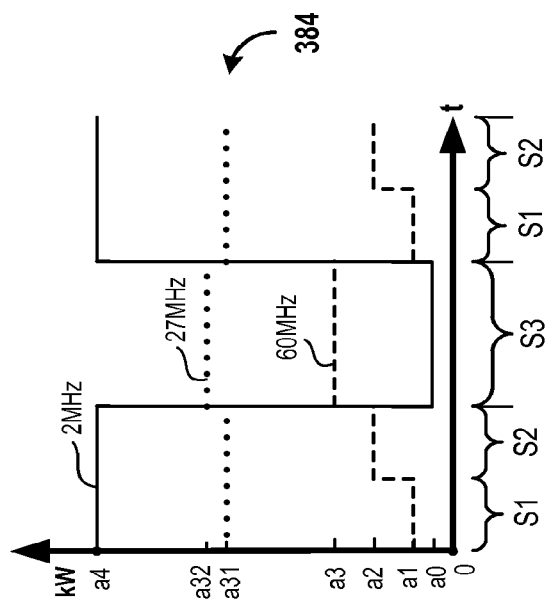
Figure 13A:
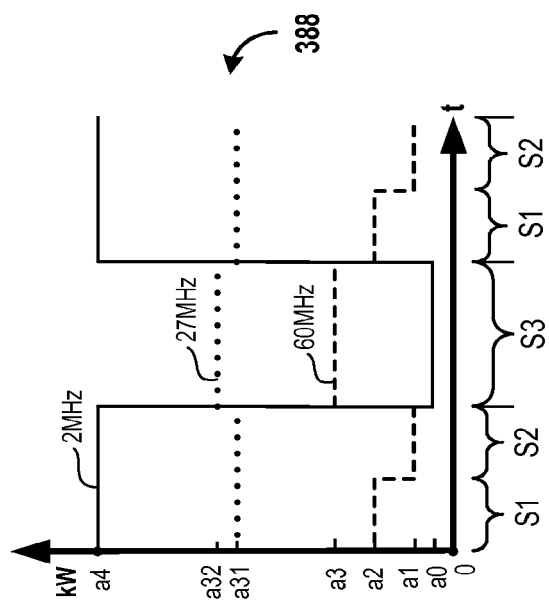

FIG. 13A is a diagram of embodiments of graphs 384, 386, 388, and 390. Each graph 384, 386, 388, and 390 plots power values in kW as a function of time t. As indicated in graph 384, a 27 MHz power signal has a power value of a31 during the states S1 and S2, and has a power value of a32 during the state S3. The remaining of graph 384 is similar to the graph 320 (FIG. 9A). Moreover, the remaining of graph 386 is similar to the graph 322 (FIG. 9A), the remaining of graph 388 is similar to the graph 324 (FIG. 9A), and the remaining of graph 390 is similar to the graph 326 (FIG. 9A).

Figure 13B:
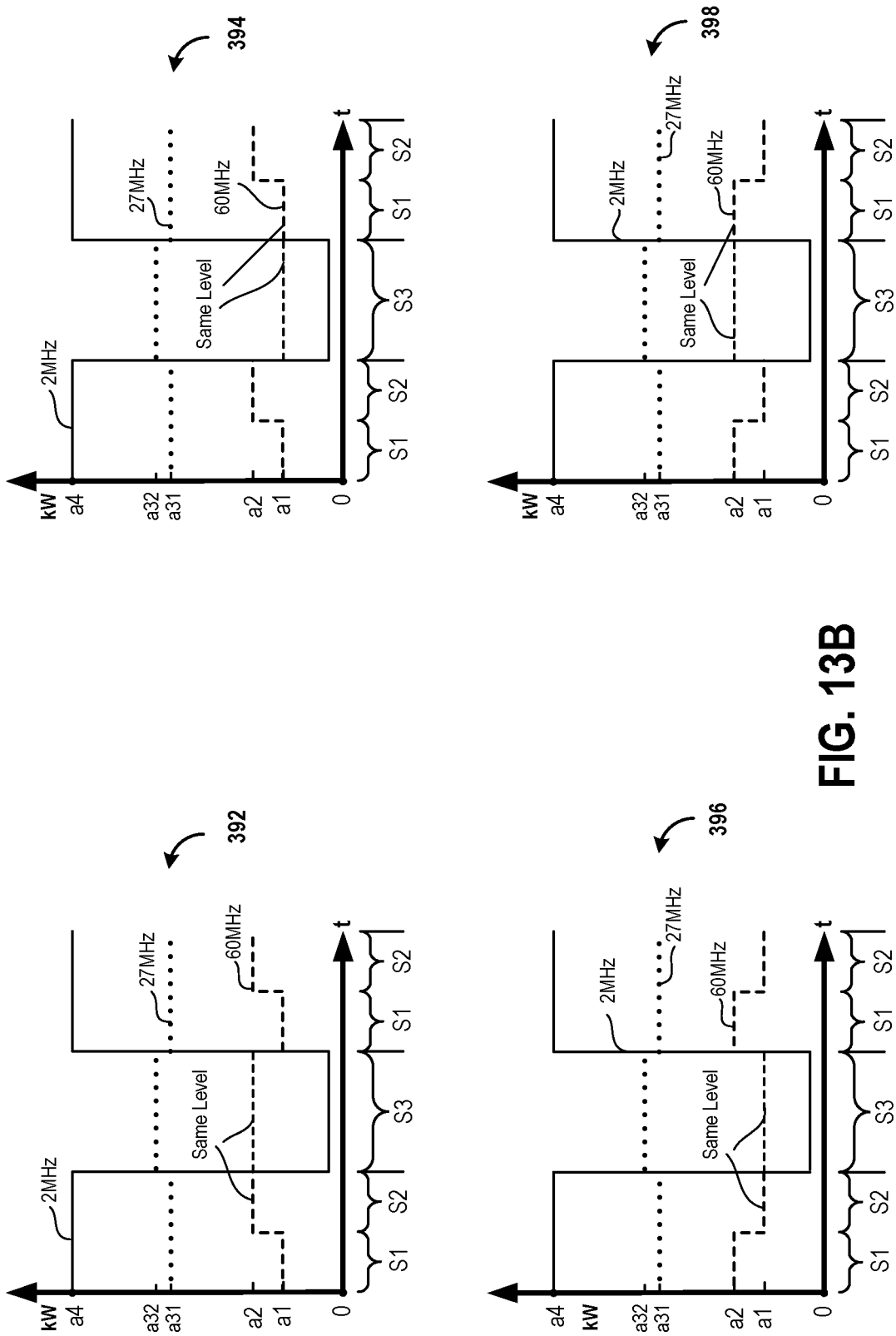
FIG. 13B is a diagram of graphs to illustrate signals generated by three RF generators, where one of the signals has the same power value for two states, another one of the signals has non-zero power values for all states, and yet another one of the signals has a same power value for two states, in accordance with an embodiment described in the present disclosure.

FIG. 13B is a diagram of embodiments of graphs 392, 394, 396, and 398. Each graph 392, 394, 396, and 398 plots power values in kW as a function of time t. As indicated in each graph 392, 394, 396, and 398, a 27 MHz power signal has a power value of a31 during the states S1 and S2, and has a power value of a32 during the state S3. The remaining of graph 392 is similar to the graph 328 (FIG. 9B). Moreover, the remaining of graph 394 is similar to the graph 330 (FIG. 9B), the remaining of graph 396 is similar to the graph 332 (FIG. 9B), and the remaining of graph 398 is similar to the graph 334 (FIG. 9B).

Figure 14A:
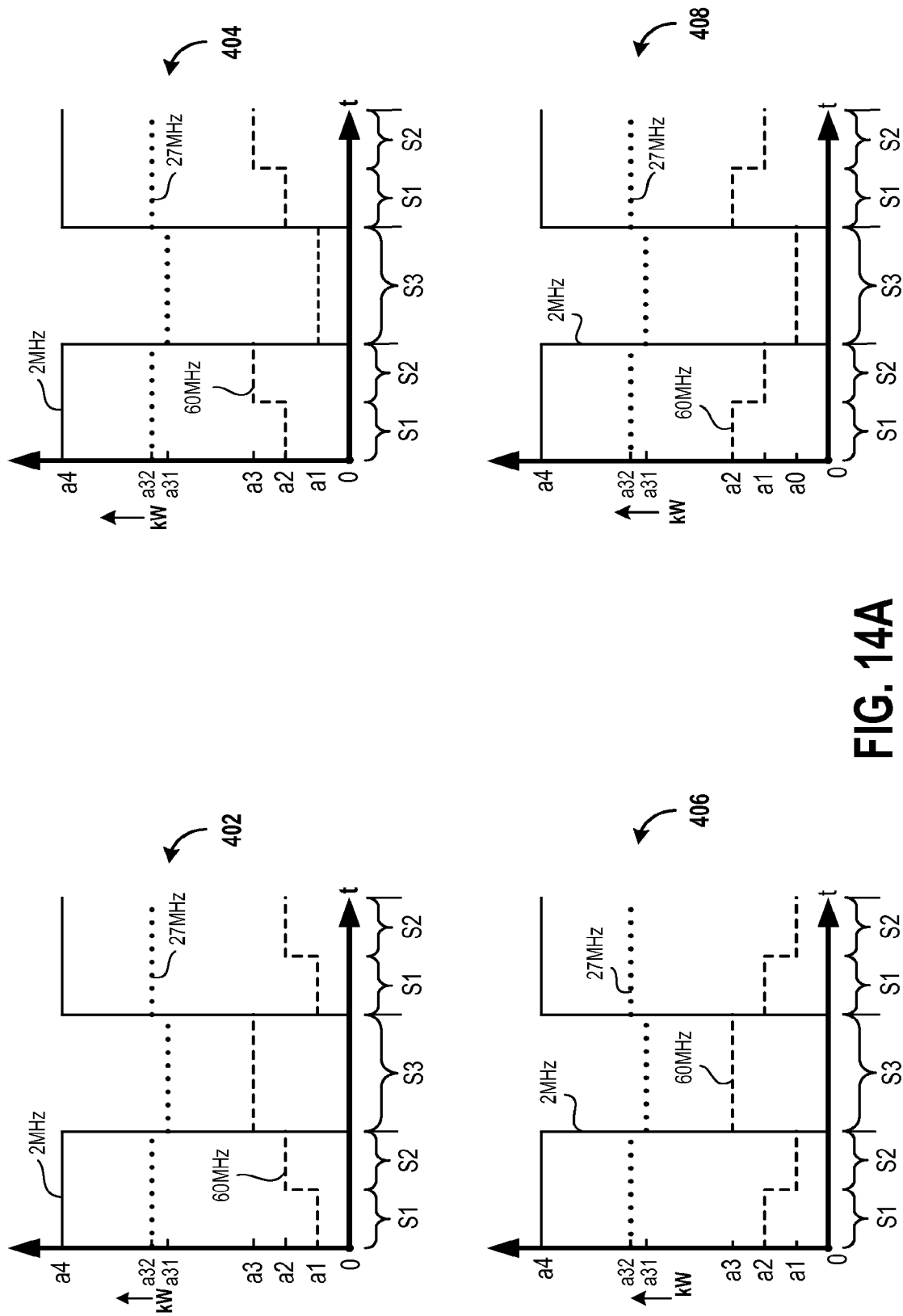
FIG. 14A is a diagram of graphs to illustrate signals generated by three RF generators, where one of the signals has a different power value for each state, another one of the signals has a power value of zero during a state, and yet another one of the signals has a same power value for two states, in accordance with an embodiment described in the present disclosure.

FIG. 14A is a diagram of embodiments of graphs 402, 404, 406, and 408. Each graph 402, 404, 406, and 408 plots power values in kW as a function of time t. As indicated in each graph 402, 404, 406, and 408, a 27 MHz power signal has a power value of a32 during the states S1 and S2, and has a power value of a31 during the state S3. The remaining of graph 402 is similar to the graph 302 (FIG. 8A). Moreover, the remaining of graph 404 is similar to the graph 304 (FIG. 8A), the remaining of graph 406 is similar to the graph 306 (FIG. 8A), and the remaining of graph 408 is similar to the graph 308 (FIG. 8A).

Figure 14B:
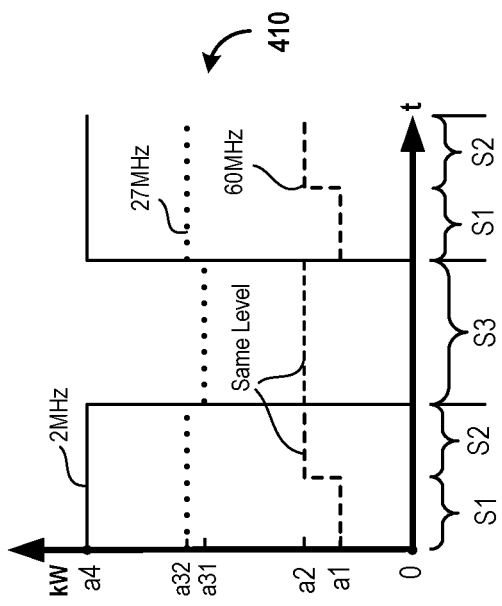
FIG. 14B is a diagram of graphs to illustrate signals generated by three RF generators, where one of the signals has the same power value for two states, another one of the signals has a power value of zero during a state, and yet another one of the signals has a same power value for two states, in accordance with an embodiment described in the present disclosure.
Figure 14B:
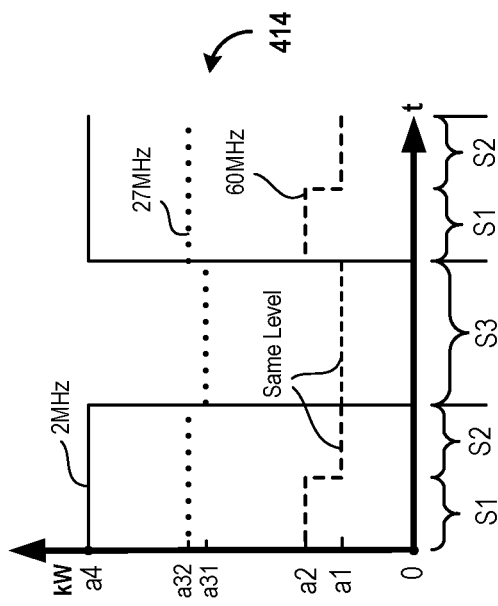
Figure 14B:
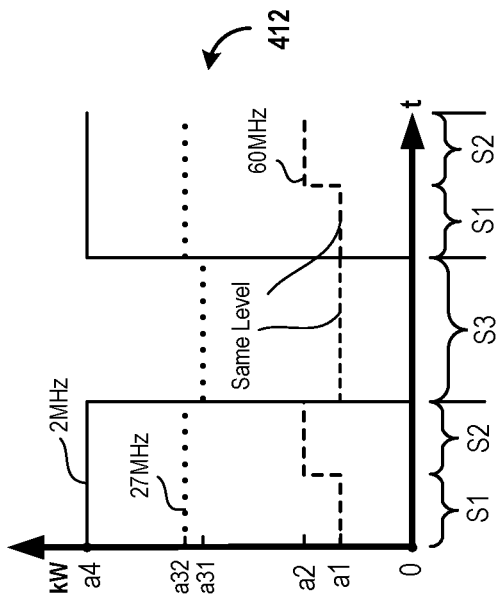
Figure 14B:
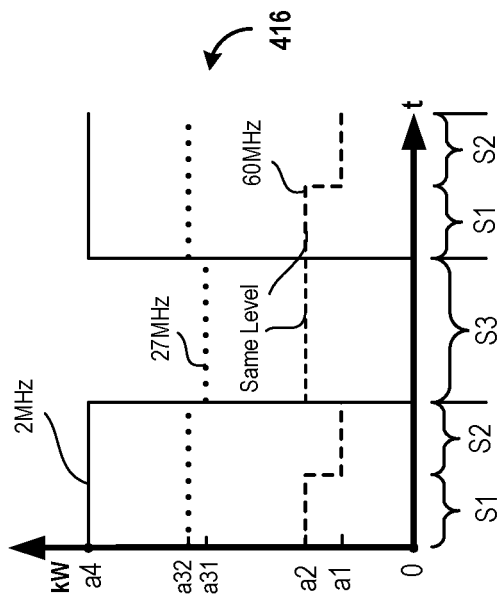

FIG. 14B is a diagram of embodiments of graphs 410, 412, 414, and 416. Each graph 410, 412, 414, and 416 plots power values in kW as a function of time t. As indicated in each graph 410, 412, 414, and 416, a 27 MHz power signal has a power value of a32 during the states S1 and S2, and has a power value of a31 during the state S3. The remaining of graph 410 is similar to the graph 310 (FIG. 8B). Moreover, the remaining of graph 412 is similar to the graph 312 (FIG. 8B), the remaining of 414 is similar to the graph 314 (FIG. 8B), and the remaining of graph 416 is similar to the graph 316 (FIG. 8B).

Figure 15A:
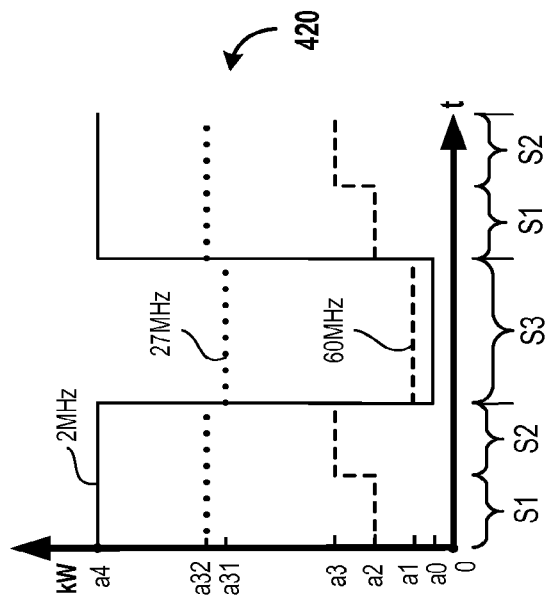
FIG. 15A is a diagram of graphs to illustrate signals generated by three RF generators, where one of the signals has a different power value for each state, another one of the signals has non-zero power values for all states, and yet another one of the signals has a same power value for two states, in accordance with an embodiment described in the present disclosure.
Figure 15A:
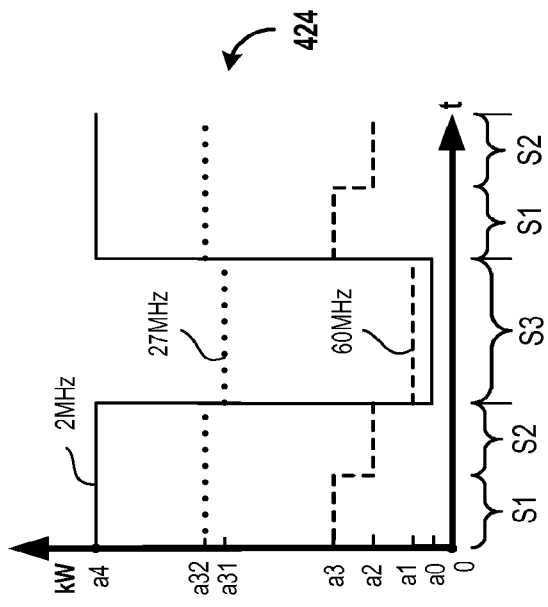
Figure 15A:
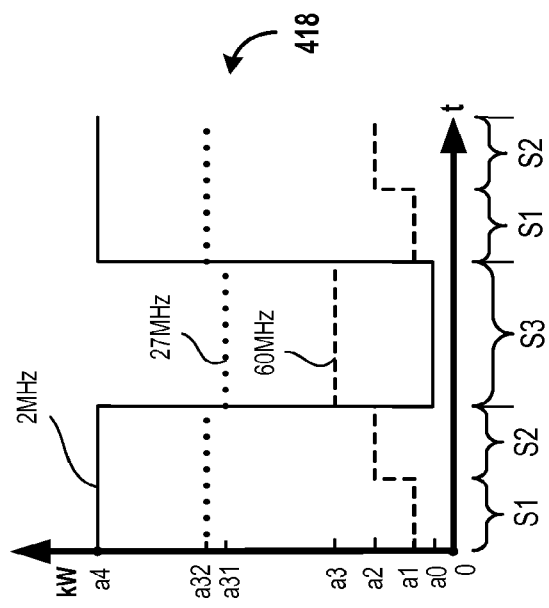
Figure 15A:
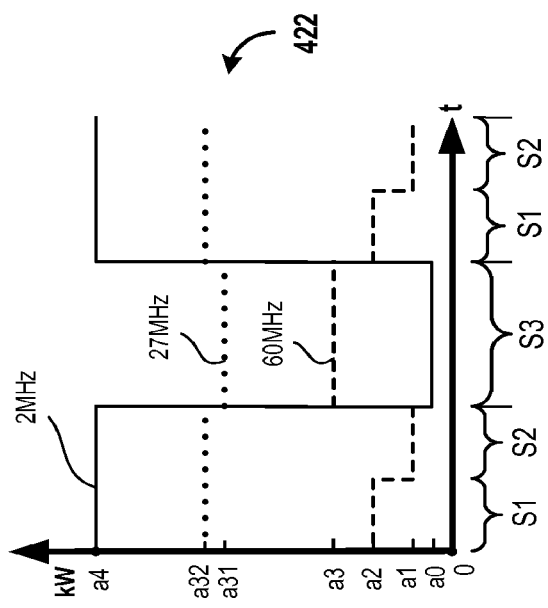

FIG. 15A is a diagram of embodiments of graphs 418, 420, 422, and 424. Each graph 418, 420, 422, and 424 plots power values in kW as a function of time t. As indicated in graph 418, a 27 MHz power signal has a power value of a32 during the states S1 and S2, and has a power value of a31 during the state S3. The remaining of graph 418 is similar to the graph 320 (FIG. 9A). Moreover, the remaining of graph 420 is similar to the graph 322 (FIG. 9A), the remaining of graph 422 is similar to the graph 324 (FIG. 9A), and the remaining of graph 424 is similar to the graph 326 (FIG. 9A).

Figure 15B:
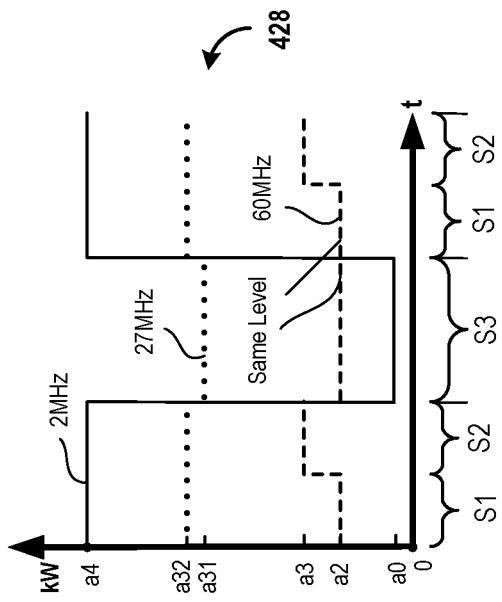
FIG. 15B is a diagram of embodiments of graphs to illustrate signals generated by three RF generators, where one of the signals has the same power value for two states, another one of the signals has non-zero power values for all states, and yet another one of the signals has a same power value for two states, in accordance with an embodiment described in the present disclosure.
Figure 15B:
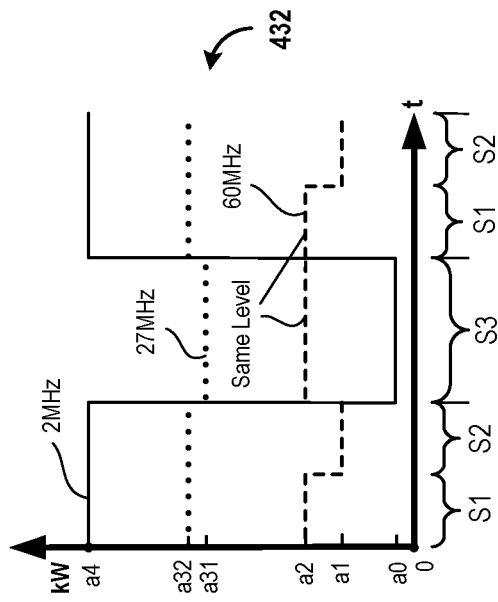
Figure 15B:
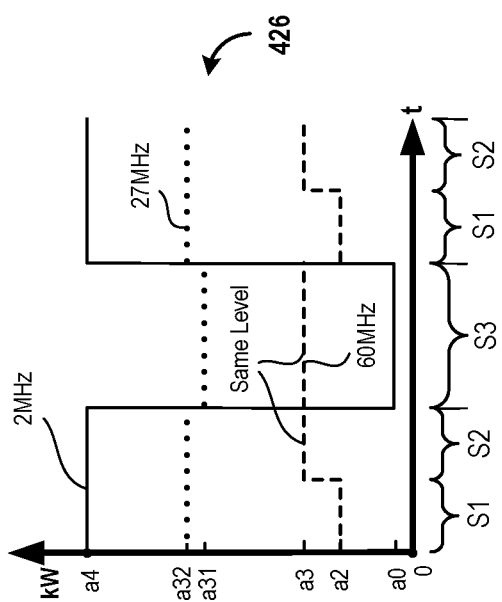
Figure 15B:
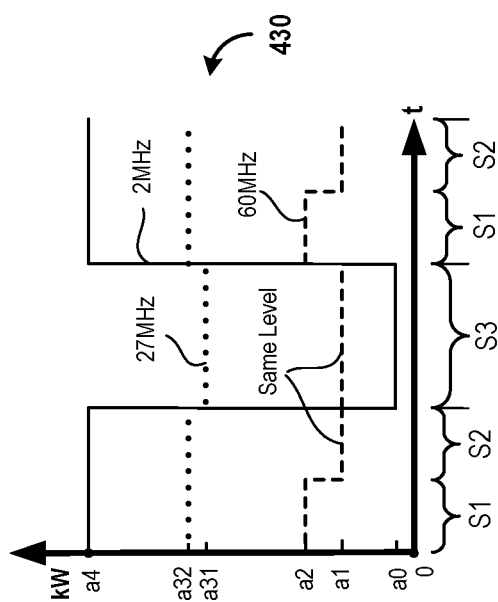

FIG. 15B is a diagram of embodiments of graphs 426, 428, 430, and 432. Each graph 426, 428, 430, and 432 plots power values in kW as a function of time t. As indicated in each graph 426, 428, 430, and 432, a 27 MHz power signal has a power value of a32 during the states S1 and S2, and has a power value of a31 during the state S3. The remaining of graph 426 is similar to the graph 328 (FIG. 9B). Moreover, the remaining of graph 428 is similar to the graph 330 (FIG. 9B), the remaining of graph 430 is similar to the graph 332 (FIG. 9B), and the remaining of graph 432 is similar to the graph 334 (FIG. 9B).

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the power supplies 160 and 162 are coupled to an inductor within the ICP plasma chamber.

It should be noted that although the above-described embodiments relate to providing the 2 MHz RF signal and/or 60 MHz RF signal and/or 27 MHz RF signal to the lower electrode 120 and grounding the upper electrode 122, in several embodiments, the 2 MHz, 60 MHz, and 27 MHz signals are provided to the upper electrode 122 while the lower electrode 120 is grounded.

In one embodiment, the operations performed by an AFT and/or a power controller of an RF generator are performed by a DSP of the RF generator. For example, the operations, described herein, as performed by the AFT 130, 132, and 134 are performed by the DSP 140 (FIG. 1). As another example, the operations, described herein, as performed by the AFT 138, the AFT 141, the AFT 142, the power controller 150, the power controller 152, and the power controller 154 are performed by the DSP 153 (FIG. 1).

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer-readable code on a non-transitory computer-readable medium. The computer-readable medium is any data storage device, e.g., a memory device, etc., that can store data, which can be thereafter be read by a computer system. Examples of the computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer-readable medium can include computer-readable tangible medium distributed over a network-coupled computer system so that the computer-readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for pulsing radio frequency (RF) generators, comprising:
generating a pulsed signal;
controlling a primary RF generator to generate a primary RF signal based on the pulsed signal to supply the primary RF signal to an electrode of a plasma chamber, wherein the primary RF signal has a first primary power level;
controlling the first primary power level of the primary RF signal to transition to a second primary power level, wherein the second primary power level is different from the first primary power level;
controlling the second primary power level of the primary RF signal to transition to a third primary power level, wherein the third primary power level is different from the first primary power level and is different from the second primary power level;
controlling a secondary RF generator to generate a secondary RF signal based on the pulsed signal to supply the secondary RF signal to the electrode, wherein the secondary RF signal has a first secondary power level; and
controlling the first secondary power level of the secondary RF signal to transition to a second secondary power level, wherein the second secondary power level is different from the first secondary power level.

2. The method of claim 1, wherein said controlling the first secondary power level of the secondary RF signal to transition to the second secondary power level is performed based on the pulsed signal.

3. The method of claim 1, further comprising controlling the second secondary power level of the secondary RF signal to transition to a third secondary power level.

4. The method of claim 3, wherein the first secondary power level, the second secondary power level, and the third secondary power level are determined during a training routine that is performed before the method is executed to process a substrate.

5. The method of claim 1, further comprising determining that a threshold is exceeded when the first primary power level of the primary RF signal transitions to the second primary power level, wherein said controlling the first secondary power level of the secondary RF signal to transition to the second secondary power level is performed upon said determining that the threshold is exceeded.

6. The method of claim 1, further comprising sending the pulsed signal to the primary and secondary RF generators.

7. The method of claim 1, further comprising:
controlling the second secondary power level of the secondary RF signal to transition to a third secondary power level; and
determining that a threshold is exceeded when the second primary power level of the primary RF signal transitions to the third primary power level, wherein said controlling the second secondary power level of the secondary RF signal to transition to the third secondary power level is performed upon said determining that the threshold is exceeded.

8. The method of claim 1, further comprising:
controlling the second secondary power level of the secondary RF signal to transition to a third secondary power level;
determining that a first threshold is exceeded when the first primary power level of the primary RF signal transitions to the second primary power level, wherein said controlling the first secondary power level of the secondary RF signal to transition to the second secondary power level is performed upon said determining that the first threshold is exceeded; and
determining that a second threshold is exceeded when the second primary power level of the primary RF signal transitions to the third primary power level, wherein said controlling the second secondary power level of the secondary RF signal to transition to the third secondary power level is performed upon said determining that the second threshold is exceeded.

9. The method of claim 1, further comprising:
controlling the third primary power level of the primary RF signal to transition to the first primary power level;
controlling the second secondary power level of the secondary RF signal to transition to a third secondary power level; and
controlling the third secondary power level of the secondary RF signal to transition to the first secondary power level.

10. The method of claim 9, further comprising:
determining that a threshold is exceeded when the third primary power level of the primary RF signal transitions to the first primary power level, wherein said controlling the second secondary power level of the secondary RF signal to transition to the first secondary power level is performed upon said determining that the threshold is exceeded.

11. The method of claim 1, wherein the electrode is a lower electrode, wherein said controlling the primary RF generator and the secondary RF generator occurs when an upper electrode of the plasma chamber is grounded.

12. The method of claim 11, wherein the upper electrode is located above the lower electrode and faces the lower electrode.

13. The method of claim 1, further comprising sending the pulsed signal to a digital signal processor of the primary RF generator and to a digital signal processor of the secondary RF generator.

* * * * *